(12) United States Patent
Wano

(10) Patent No.: US 7,567,030 B2
(45) Date of Patent: Jul. 28, 2009

(54) ORGANIC ELECTROLUMINESCENT DEVICE, METHOD OF MANUFACTURING ORGANIC ELECTROLUMINESCENT DEVICE, AND ELECTRONIC APPARATUS

(75) Inventor: Hiromi Wano, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 380 days.

(21) Appl. No.: 11/457,928

(22) Filed: Jul. 17, 2006

(65) Prior Publication Data

US 2007/0052345 A1    Mar. 8, 2007

(30) Foreign Application Priority Data

Sep. 5, 2005    (JP)    ............... 2005-256080

(51) Int. Cl.
*H01J 1/62*    (2006.01)
*H01J 63/04*    (2006.01)

(52) U.S. Cl. .................. 313/504; 313/506; 313/116; 257/E33.074; 445/23; 362/246; 362/355; 430/311; 430/322

(58) Field of Classification Search ............... 313/504, 313/506, 116; 257/E33.074; 445/23; 362/246, 362/355
See application file for complete search history.

(56) References Cited

U.S. PATENT DOCUMENTS

| | | | |
|---|---|---|---|
| 5,294,870 A * | 3/1994 | Tang et al. ............... 313/504 |
| 6,630,684 B2 | 10/2003 | Lee et al. | |
| 6,777,871 B2 * | 8/2004 | Duggal et al. ............... 313/506 |
| 6,787,796 B2 * | 9/2004 | Do et al. ..................... 257/40 |
| 7,030,555 B2 * | 4/2006 | Nakamura et al. .......... 313/504 |
| 7,205,714 B2 * | 4/2007 | Chen ........................ 313/504 |
| 2001/0026124 A1 * | 10/2001 | Liu et al. ................... 313/504 |
| 2004/0017152 A1 | 1/2004 | Hashimoto et al. | |
| 2004/0211971 A1 | 10/2004 | Takei et al. | |
| 2005/0202348 A1 * | 9/2005 | Nakayama et al. .......... 430/311 |
| 2005/0275343 A1 * | 12/2005 | Tanaka et al. ............... 313/504 |
| 2006/0232195 A1 * | 10/2006 | Cok et al. ................... 313/504 |
| 2007/0103056 A1 * | 5/2007 | Cok ........................... 313/503 |

FOREIGN PATENT DOCUMENTS

| | | |
|---|---|---|
| JP | A 2001-76864 | 3/2001 |
| JP | A 2004-022438 | 1/2004 |
| KR | 2003-26450 A | 4/2003 |

\* cited by examiner

*Primary Examiner*—Nimeshkumar D. Patel
*Assistant Examiner*—Thomas A Hollweg
(74) *Attorney, Agent, or Firm*—Oliff & Berridge PLC

(57) ABSTRACT

An organic electroluminescent device includes, on a substrate, a pixel having a luminescent functional layer which is sandwiched by a first electrode and a second electrode, and a unit pixel group composed of a plurality of the pixels. A scattering portion which scatters luminescent light of the luminescent functional layer is provided in a pixel selected from the unit pixel group.

14 Claims, 9 Drawing Sheets

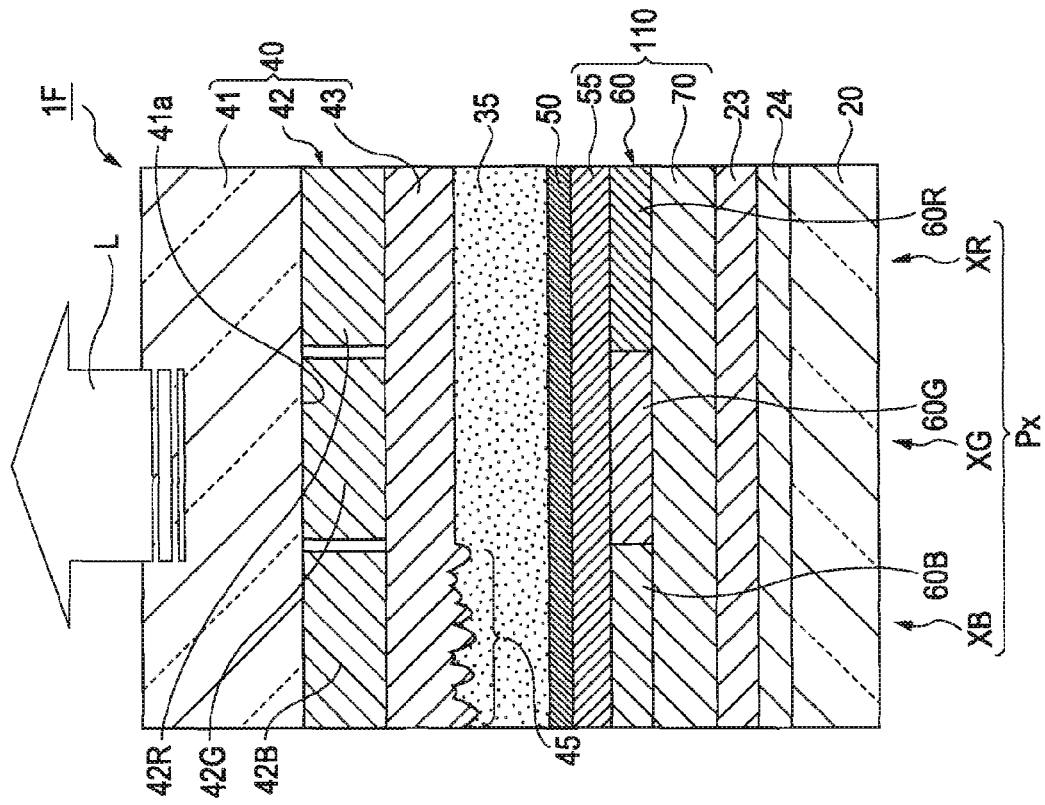
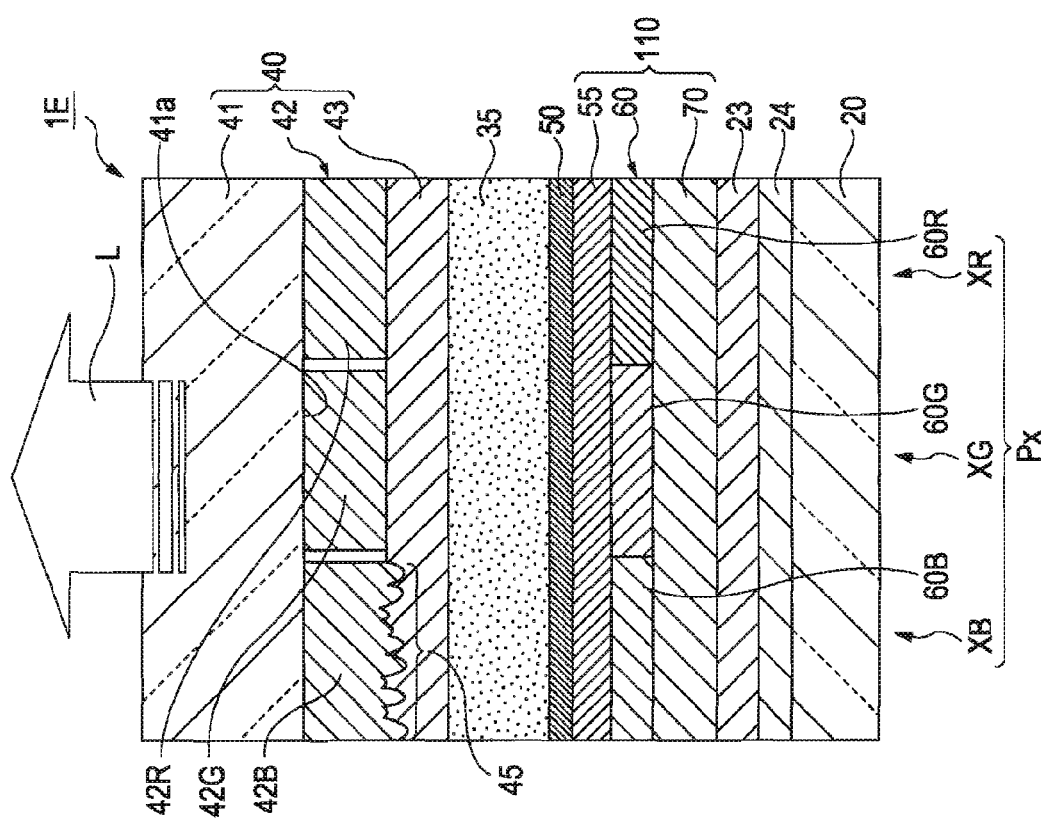

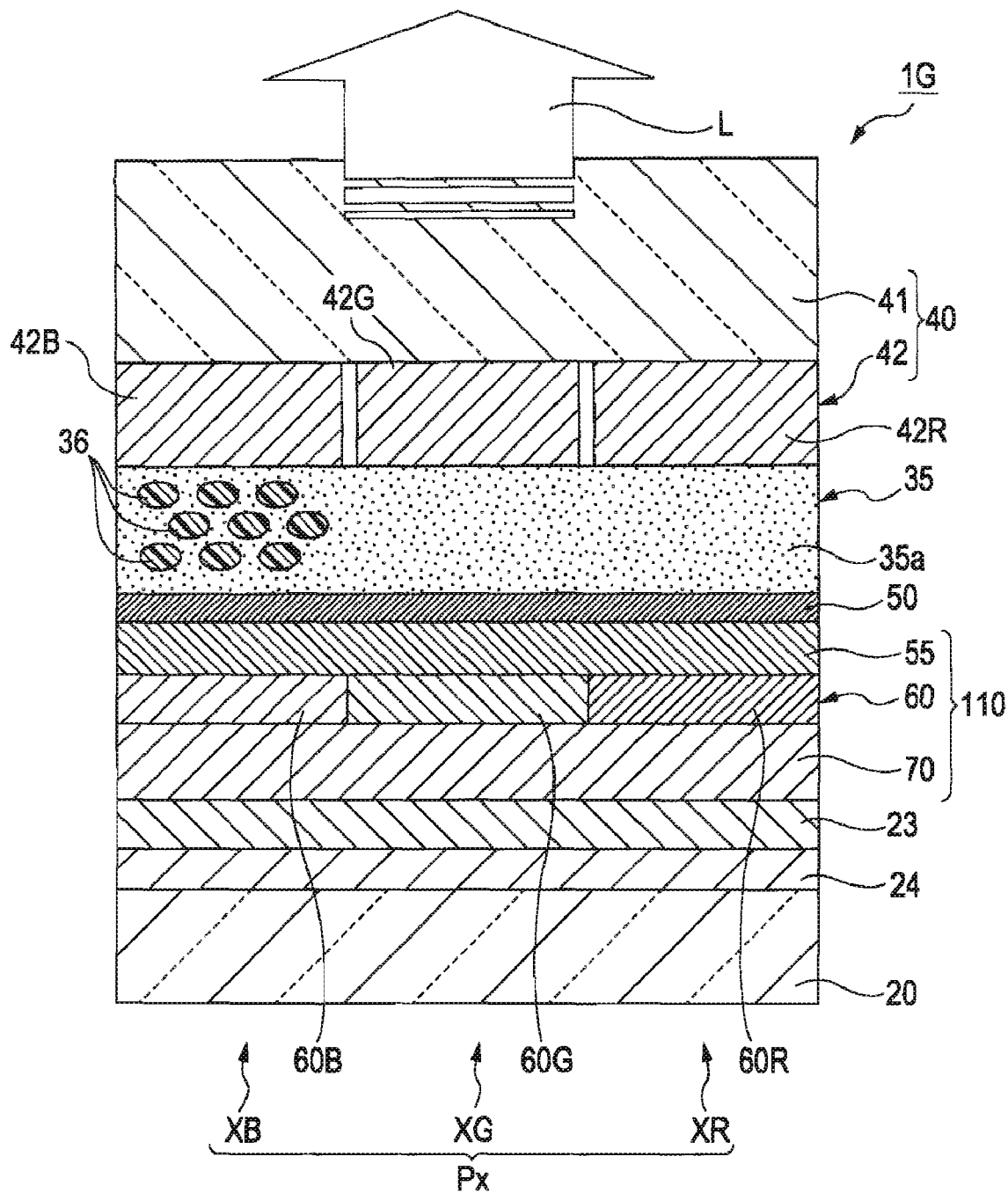

ated in the scattering portion. As a result, since interference light beams having the optical path length which is intended originally become dominant, and interference light beams other than them have various kinds of optical path length, i.e., are in various colors, they are not recognized and averaged visually and are seen as originally intended luminescent color. Therefore, color shift and luminance change when being viewed from the front face and when being viewed from the wide angle, is small, and there is no significant difference between them, and it is possible to obtain favorable display quality.

ORGANIC ELECTROLUMINESCENT DEVICE, METHOD OF MANUFACTURING ORGANIC ELECTROLUMINESCENT DEVICE, AND ELECTRONIC APPARATUS

BACKGROUND

1. Technical Field

The present invention relates to an organic electroluminescent device, a method of manufacturing the organic electroluminescent device, and an electronic apparatus.

2. Related Art

As a display device for electronic apparatuses, such as a portable telephone, a personal computer, and PDA (Personal Digital Assistant), or as an exposure head for image forming apparatuses, such as a digital copier and a printer, a light-emitting device, such as an organic electroluminescent device (hereinafter referred to as organic EL device) attract attention. In configuring this type of light-emitting device for color display, in the related art, the material which constitutes a luminescent layer is changed for every pixel so that the light of each color may be emitted from each pixel.

In recent years, a structure in which irregularities are formed on a glass substrate of an organic EL device with a sacrificial oxide firm so that confinement of emitting light can be avoided to improve light extraction efficiency is proposed (for example, refer to JP-A-2001-76864). Further, an organic EL device of top emission structure in which a reflective layer of an underlying substrate is provided with irregularities, and the refractive index of a layer which planarizes the irregularities is made greater than the refractive index of the luminescent layer to cause emitting light to be scattered so that deterioration of the luminescent layer can be prevented to extend the lifespan of elements, is proposed (for example, refer to JP-A-2004-22438).

Meanwhile, the inventors have found out the problems that display colors are seen in a varied fashion or luminance changes, when a case in which a panel of an organic EL device is viewed from the front face is compared with a case in which the panel is viewed from a wide angle (an oblique direction other than the front face).

SUMMARY

An advantage of the invention is that it provides an organic EL device, a method of manufacturing the organic EL device, an electronic apparatus, which do not cause any color shift or luminance change, even when an observer sees from the front face, or even when the observer sees from a wide angle.

The inventors paid their attention to the luminescent light of a luminescent layer of an organic EL device which is emitted to the observer side as it is, and the luminescent light thereof which is emitted to the observer side after being reflected by an electrode. The inventors have also found out that, since such luminescent lights interfere with each other, their optical path lengths may be different from each other in a case in which the panel of the organic EL device is viewed from the front face, and in a case in which it is viewed from a wide angle (an oblique direction other than the front face). As a result, in an organic EL device of related art, there was a problem in that, due to occurrence of any color shift, colors are seen in a varied fashion or luminance changes according to an angle at which an observer sees.

The inventors have also found out that, if such color shift or luminance change occurs, the wavelength from which a peak under interference conditions is obtained may be biased to the short wavelength side. This phenomenon is particularly conspicuous in blue color having a short wavelength. This is because, if wavelength becomes short in a wavelength range of blue color, spectral sensitivity becomes low. Therefore a luminance change may be easily recognized visually.

Moreover, in a case in which an organic material is used as the structure of the luminescent layer, since a refractive index tends to increase due to wavelength dispersion in a wavelength of blue color, a viewing angle of blue color is apt to become increasingly narrower in three primary colors (red, green, and blue colors). Accordingly, display quality may deteriorate remarkably.

Further, if a phenomenon that only a viewing angle of blue color is narrow occurs in a direct-viewing-type organic EL device, chromaticity of blue color may drop, and a yellow tinge may be took on, which results in deterioration of display quality when an observer views the panel of the organic EL device from an oblique direction in a state in which trichromatic full color is displayed.

Further, since green color having spectral sensitivity higher than other colors is slightly long in wavelength, a slight color difference may be easily recognized visually, though not so serious as those with blue color. As a result, the same problem as blue color occurs. Therefore, when an observer views a panel of an organic EL device from an oblique direction thereof, green color may be changed and consequently become emerald green.

Moreover, in a case in which high-molecular-weight material is adopted as the material for a luminescent layer of green color, the problem of green color shift is remarkable. A polyphenylene-vinylene-based material is known widely as the material of green color. This material has an emission spectrum peak in a yellowish range. Therefore, in a structure in which a green (around 550 nm) light beam is extracted to the front face, when an organic EL device is observed from an oblique direction other than the front face, an interference peak may shift to a short wavelength due to interference within a layer structure, and an interference peak comes to a wavelength with weak emission intensity.

As a result, a problem occurs in that it is not possible to extract light of around 550 nm. As a result, a viewing angle for green color may be narrow, and the green color when being observed from a wide angle may be conspicuously tinged with yellow color. In particular, since green color has high spectral sensitivity, it may be shifted to a color which is easily recognized, and consequently display quality may deteriorate.

Further, if there are the above-mentioned problems with blue and green colors, in a trichromatic full color organic EL device, the color temperature of a display image when being viewed from an oblique direction may drop considerably, and consequently display quality may deteriorate.

Thus, the inventors have conceived the invention which has the following means in order to solve the above problems.

Specifically, according to an aspect of the invention, an organic EL device includes, on a substrate, a pixel having a luminescent functional layer which is sandwiched by a first electrode and a second electrode, and a unit pixel group composed of a plurality of the pixels. A scattering portion which scatters luminescent light of the luminescent functional layer is provided in a pixel selected from the unit pixel group.

Thus, in a pixel where the scattering portion is formed, the interference light which has various kinds of optical path length is scattered by the scattering portion when it enters the substrate. Accordingly, since interference light beams which have various kinds of optical path length, i.e., interference light beams of various colors, coexist and are randomly radiated to an air interface, any color shift or luminance decrease when the organic EL device is viewed from an oblique direction (wide angle) can be suppressed.

Further, in the organic EL device according to the aspect of the invention, in the unit pixel group, the plurality of pixels emit red, green, and blue light, respectively, and the scattering portion is formed in a green pixel and/or a blue pixel.

Here, it is known that, in a wavelength range of visible light, red light has a peak in a long wavelength range, green light has a peak in an intermediate wavelength range, and blue light has a peak in a short wavelength range.

Accordingly, according to the aspect of the invention, since interference light beams which have various kinds of optical path length, i.e., interference light beams of various colors coexist in a green pixel and/or a blue pixel and are randomly radiated to an air interface, any color shift or luminance decrease when the organic EL device is viewed from an oblique direction (wide angle) can be suppressed.

Further, in the organic EL device according to the aspect of the invention, the scattering portion is formed by having a concave and convex portion, which allows the surface of the substrate to scatter visible light, between the substrate and the luminescent functional layer.

Thus, since interference light beams which have various kinds of optical path length, i.e., interference light beams of various colors coexist by the concave and convex portion and the light beams are randomly radiated to an air interface, any color shift or luminance decrease when the organic EL device is viewed from an oblique direction (wide angle) can be suppressed.

Further, in the organic EL device according to the aspect of the invention, a planarizing layer is formed in contact with the scattering portion.

This causes the surface of the substrate to be leveled. As a result, the planarizing layer makes irregularities of the surface of the substrate flat to control display defects of the organic EL device.

Further, in the organic EL device according to the aspect of the invention, the refractive index of the planarizing layer is different from the refractive index of the substrate.

Here, it is preferable that the refractive index difference be 0.08 or more. Thus, since light is scattered more suitably, the luminance can be improved.

Further, in the organic EL device according to the aspect of the invention, the scattering portion is a reflective layer formed in the concave and convex portion.

Thus, the reflective layer becomes a layer film which has a convexo-concave surface in imitation of the shape of the concave and convex portion. Accordingly, the light which hits the reflective layer can be reflected and scattered.

Further, in the organic EL device according to the aspect of the invention, the device further includes a counter substrate arranged to face the substrate and a bonding layer which bonds the substrate and the counter substrate together. The scattering portion is a concave and convex portion formed on the surface of the counter substrate between the counter substrate and the luminescent functional layer.

Thus, since interference light beams which have various kinds of optical path length, i.e., interference light beams of various colors coexist by the concave and convex portion and the light beams are randomly radiated to an air interface, any color shift or luminance decrease when the organic EL device is viewed from an oblique direction (wide angle) can be suppressed.

Further, in the organic EL device according to the aspect of the invention, the refractive index of the bonding layer is different from the refractive index of the counter substrate.

Here, it is preferable that the refractive index difference be 0.08 or more. Thus, since light is scattered more suitably, the luminance can be improved.

Further, in the organic EL device according to the aspect of the invention, the device further includes a color filter substrate arranged to face the substrate and a bonding layer which bonds the substrate and the color filter substrate together. The color filter substrate has a substrate body and a colored layer of plural colors corresponding to the plurality of pixels, respectively, of the unit pixel group toward the luminescent functional layer from the color filter substrate. The scattering portion is a concave and convex portion formed on the surface of the substrate body between the substrate body and the colored layer.

Thus, since luminescent light of the luminescent functional layer can be colored by the colored layer, and the luminescent light can be scattered by the concave and convex portion formed on the surface of the substrate body, the same effects as the above can be obtained.

Further, in the organic EL device according to the aspect of the invention, the device further includes a color filter substrate arranged to face the substrate and a bonding layer which bonds the substrate and the color filter substrate together. The color filter substrate has a substrate body, a colored layer of plural colors corresponding to the plurality of pixels, respectively, of the unit pixel group toward the luminescent functional layer from the color filter substrate, and an overcoat layer. The scattering portion is a concave and convex portion formed on the surface of the overcoat layer and/or on the surface of the colored layer.

Thus, since luminescent light of the luminescent functional layer can be colored by the colored layer, and the luminescent light can be scattered by the concave and convex portion formed on the surface of the overcoat layer or on the surface of the colored layer, the same effects as the above can be obtained.

Further, in the organic EL device according to the aspect of the invention, the bonding layer has resin filler and particles, serving as the scattering portion, and the refractive index of the particles is different from the refractive index of the resin filler.

Here, it is preferable that the refractive index difference be 0.08 or more. Thus, since light is scattered more suitably, the luminance can be improved.

According to another aspect of the invention, a method of manufacturing an organic EL device includes, on a substrate, a pixel having a luminescent functional layer which is sandwiched by a first electrode and a second electrode, and a unit pixel group composed of a plurality of the pixels. The method includes forming a scattering portion, which scatters luminescent light of the luminescent functional layer, in a pixel selected from the unit pixel group.

Thus, in a pixel where the scattering portion is formed, the interference light which has various kinds of optical path length is scattered by the scattering portion when it enters the substrate. Accordingly, since interference light beams which have various kinds of optical path length, i.e., interference light beams of various colors, coexist and are randomly radiated to an air interface, any color shift or luminance decrease when the organic EL device is viewed from an oblique direction (wide angle) can be suppressed.

Further, in the method of manufacturing an organic EL device according to the aspect of the inventions the step of forming the scattering portion includes performing hydrofluoric acid treatment on the substrate or patterning any one of silicon oxide, silicon nitride and a resin layer on the substrate, thereby forming a concave and convex portion in the substrate.

Further, in the method of manufacturing an organic EL device according to the aspect of the invention, the step of forming a scattering portion includes forming a resin layer and thereafter performing ozone plasma treatment on the resin layer, thereby forming a concave and convex portion in the resin layer.

Thus, a minute concave and convex portion can be formed.

Further, according to a further aspect of the invention, an electronic apparatus includes the organic EL device according to any one of the above aspects of the invention. Thus, it is possible to obtain an electronic apparatus including a display that high luminance is realized, and any color shift is suppressed.

BRIEF DESCRIPTION OF THE DRAWINGS

The invention will be described with reference to the accompanying drawings, wherein like numbers reference like elements.

FIG. 8 is a sectional view schematically showing the configuration of an organic EL element related to a thirteenth embodiment of the invention.

FIG. 9 is a sectional view schematically showing the configuration of an organic EL element related to a sixteenth embodiment of the invention.

DESCRIPTION OF EXEMPLARY EMBODIMENTS

Figure 1:
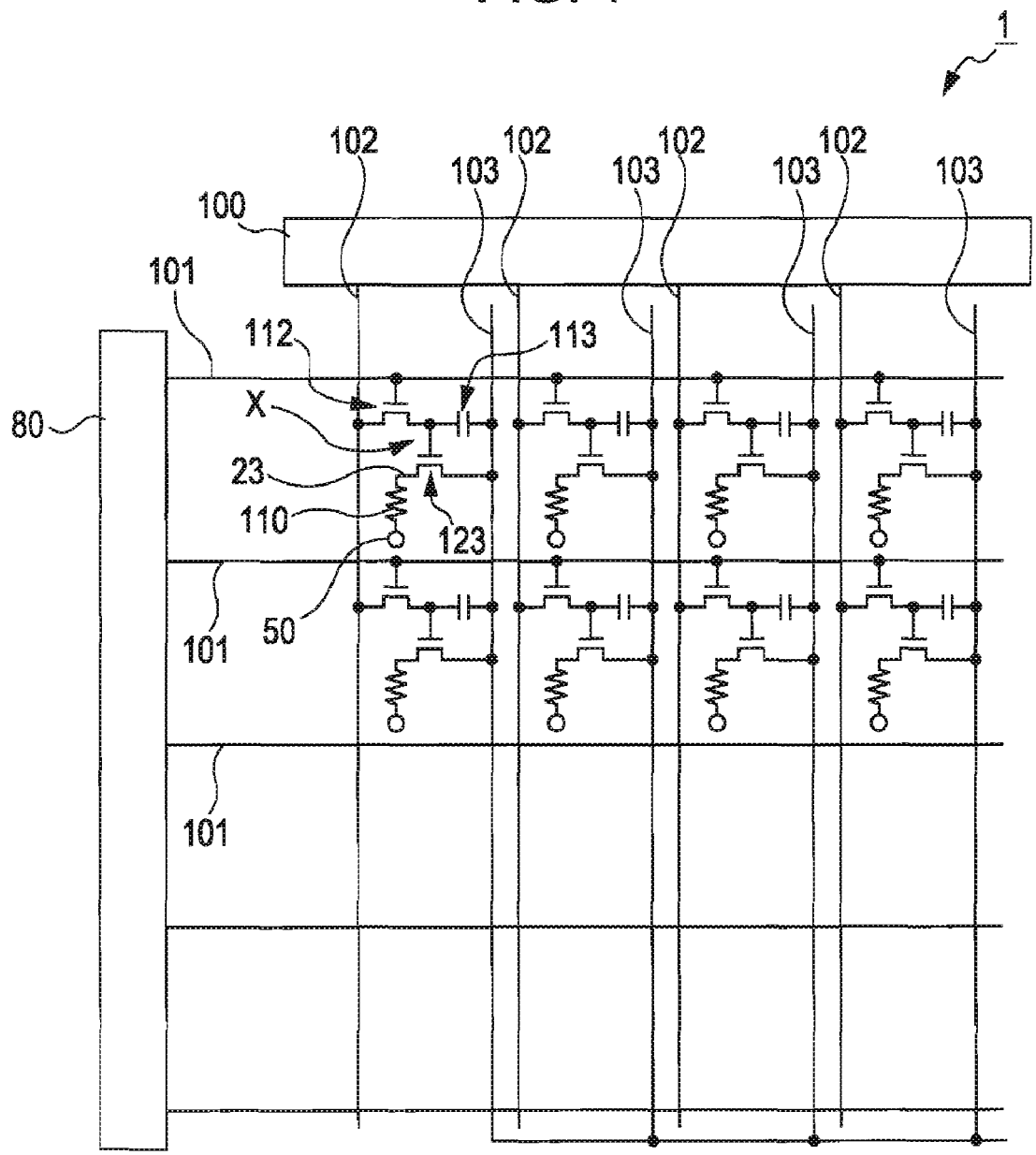
FIG. 1 is a schematic view showing the wiring structure of an organic EL panel related to the organic EL device of the invention.

Hereinafter, the invention will be described in detail.

In addition, this embodiment showing some aspects of the invention does not limit the invention, but can be arbitrarily changed within the scope of the technical idea of the invention. In addition, scales of individual layers and members in respective drawings shown below are made different from each other so that the individual layers and members have recognizable sizes in the drawings.

Organic EL Panel

First, an embodiment of an organic EL panel related to the organic EL device of the invention will be described.

FIG. 1 is a schematic view showing the wiring structure of the organic EL panel 1.

The organic EL panel 1 of this embodiment is of an active matrix system using thin film transistors (hereinafter referred to as TFTs) as switching elements, and has a wiring structure composed of a plurality of scanning lines 101, a plurality of signal lines 102 extending in a direction which intersects at a right angle to each scanning line 101, and a plurality of Dower source lines 103 extending in parallel with each signal line 102. Pixels X are formed near respective intersections of the scanning lines 101 and the signal lines 102.

Of course, according to the technical idea of the invention, the active matrix driving using TFTs, etc. is not essential, and even if the invention is carried out using a simple matrix-oriented substrate for simple matrix driving, the completely same effects can be obtained at low cost.

A data line driving circuit 100 including a shift register, a level shifter, a video line, and an analog switch is connected to the signal lines 102. Further, a scanning line driving circuit 80 including a shift register and a level shifter is connected to the scanning lines 101.

Furthermore, each pixel X is provided with a switching TFT (switching element) 112 to the gate electrode of which a scanning signal is supplied via a scanning line 101, a storage capacitor 113 which holds a pixel signal supplied from a signal line 102 via the switching TFT 112, a driving TFT (switching element) 123 to the gate electrode of which the pixel signal held by the storage capacitor 113 is supplied, a pixel electrode (first electrode) 23 into which a driving current flows from a power source line 103 when it is electrically connected with the power source line 103 via the driving TFT 123, and a luminescent functional layer 110 sandwiched between the pixel electrode 23 and a negative electrode (second electrode) 50.

Next, concrete aspects of the organic EL panel 1 of this embodiment will be described with reference to FIGS. 2 and 3. Here, FIG. 2 is a plan view schematically showing the configuration of the organic EL panel FIG. 3 is a sectional view schematically showing a unit pixel group of organic EL elements which constitutes the organic EL panel 1.

First, the configuration of the organic EL panel 1 will be described with reference to FIG. 2.

Figure 2:
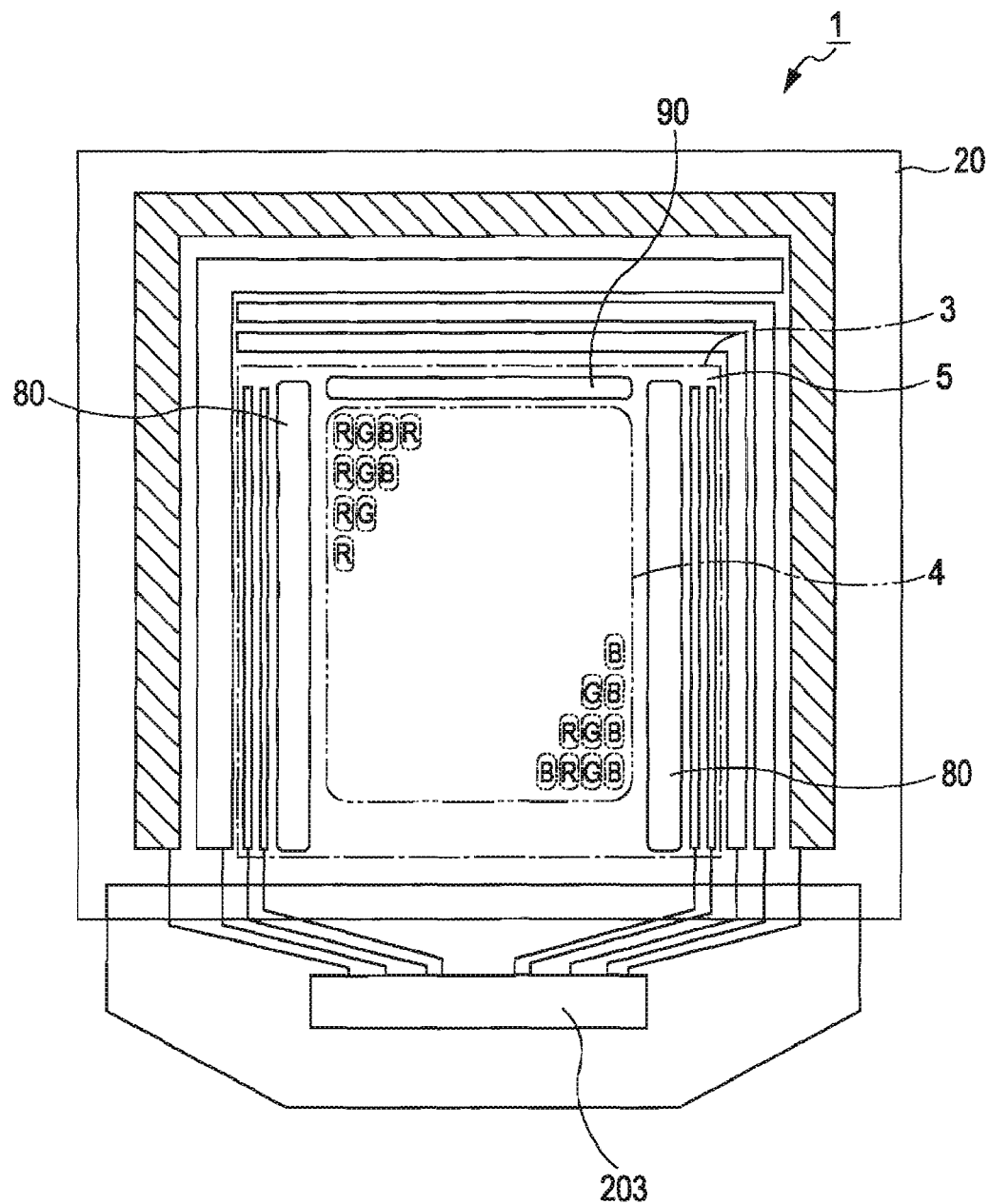
FIG. 2 is a plan view schematically showing the configuration of the organic EL panel related to the organic EL device of the invention.
Figure 3:
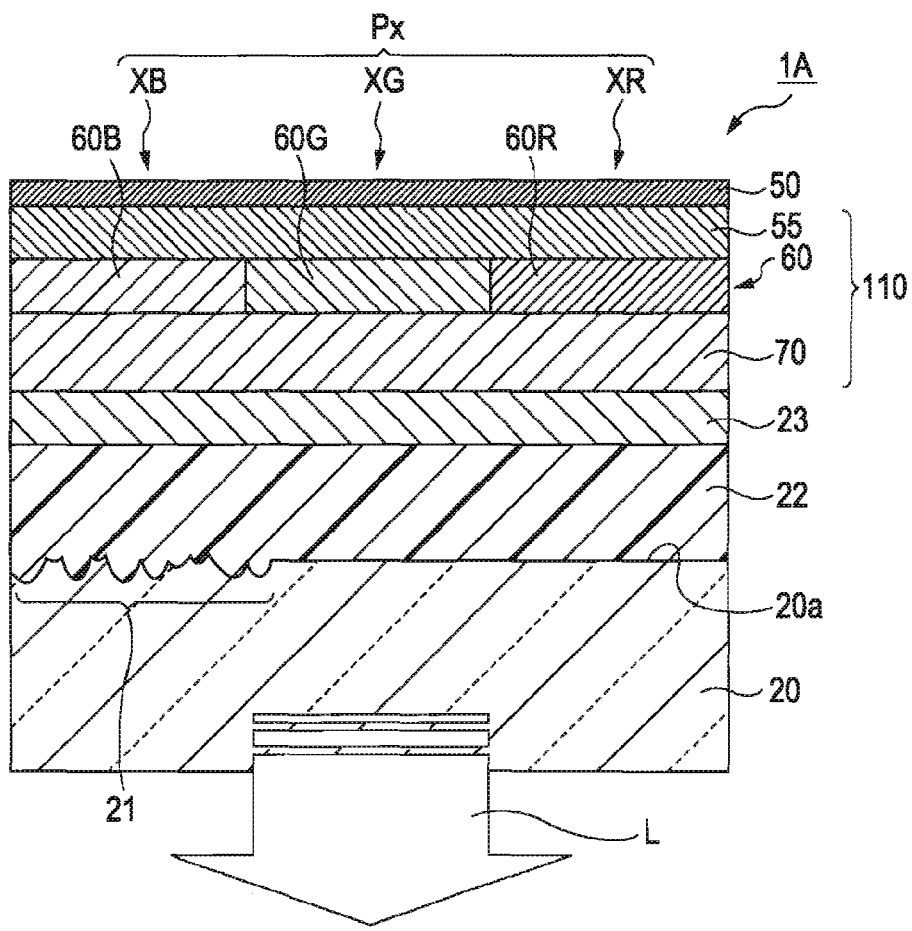
FIG. 3 is a sectional view schematically showing the configuration of an organic EL element related to a first embodiment of the invention.

FIG. 2 is a view showing the organic EL panel 1 which causes the luminescent functional layer 110 to emit light by various wiring lines TFTs, pixel electrodes, and various circuits, which are formed on the substrate 20.

As shown in FIG. 2, the organic EL panel 1 includes a substrate 20 having electrical insulating properties, the pixels X in which the pixel electrodes 23 connected to the switching TFTs 112 are arranged in a matrix on the substrate 20 (refer to FIG. 1), the power source lines 103 which are arranged around the pixels X and connected to the respective pixel electrodes 103, and a pixel portion 3 (within a frame shown by a one-dotted chain line in FIG. 2) which are located at least on the pixels X, and is generally rectangular in plan view.

In addition, in this embodiment, the pixel portion 3 is divided into an actual display region 4 (within a frame shown by a two-dotted chain line) at its central portion, and a dummy region 5 (region between the one-dotted chain line and the two-dotted chain line) arranged around the actual display region 4.

In the actual display region 4, red pixels XR, green pixels XG, and blue pixels XB which emit red light (R), green light (B), and blue light (B), respectively, are regularly arranged in the right-and-left direction in the figure. Further, the respective color pixels XR, XG, and XB are arranged in the same color in a longitudinal direction in the figure to constitute a so-called stripe arrangement. Further, the respective color pixels XR, XG, and XB are configured to have the luminescent functional layer 110 which emits light in each color of RGB with the operation of the above-mentioned TFTs 112 and 123. Also, the respective color pixels XR, XG, and XB are unified to constitute a unit pixel group Px (described below), and the unit pixel group Px causes luminescent colors of RGB to be mixed with each other, thereby performing a full color display. Accordingly, a full color image is displayed in the actual display region 4 which is configured by arrangement of the unit pixel group Px in a matrix.

Further, scanning a line driving circuits 80 and 80 are arranged on both sides of the actual display region 4 in FIG. 2. These scanning line driving circuits 80 and 80 are located and provided on the lower layer side of the dummy region 5.

Further, an inspection circuit 90 is arranged on the upper side of the actual display region 4 in FIG. 2, and this inspection circuit 90 is arranged and provided on the lower layer side of the dummy region 5. This inspection circuit 90 is a circuit for inspecting the operational state of the organic EL panel. The inspection circuit is provided with, for example, an inspected information output means (not shown) to output inspection results to the outside, and is configured so that inspection of the quality and defects of the organic EL panel 1 during manufacture or at the time of shipment can be performed.

A driving voltage of the scanning line driving circuits 80 and the inspection circuit 90 is applied via a driving voltage conducting portion (not shown) from a predetermined power source unit. Further, a driving control signal and a driving voltage to the scanning line driving circuits 80 and the inspection circuit 90 are transmitted and applied via a driving control signal conducting portion (not shown) and a driving voltage conducting portion (not show) from a predetermined main driver which controls the operation of the organic EL panel 1. In addition, the driving control signal in this case is a command signal from a main driver, etc. related to the control when the scanning mine driving circuit 80 and the inspection circuit 90 output signals.

First Embodiment of Organic EL Element

Next, with reference to FIG. 3, the structure of a unit pixel group of an organic EL element will be described about the first embodiment of the organic EL element which constitutes the organic EL panel 1.

In addition, referring to FIG. 3, a pixel electrode 23, a luminescent functional layer 110, and a negative electrode 50 which constitute the organic EL element will be described in detail. It is assumed herein that a driving TFT 123 is connected to the pixel electrode 23. Further, the pixel electrode 23 is formed in each of a red pixel XR, a green pixel XG, and a blue pixel XB so THAT it is caused to emit light for every pixel by the driving TFT 123, as shown in FIG. 1.

As shown in FIG. 3, the unit pixel group Px of the organic EL element (organic EL device) 1A includes the luminescent functional layer 110 which is sandwiched between the pixel electrode 23 and the negative electrode 50 on the substrate 20. Further, a sealing substrate (not shown) arranged to face the substrate 20 is provided, and each of the electrodes 23 and 50, and the luminescent functional layer 110 are arranged between the substrate 20 and the sealing substrate. A space into which inert gas, such as nitrogen gas, is filled, is defined between the substrate 20 and the sealing substrate, and it is kept dry by a drying agent or a getter agent, which is not shown.

Further, the luminescent functional layer 110 has a different luminescent material for each of the red pixel XR, the green pixel XG, and the blue pixel XB, and emits light in each color of RGB. Further, luminescent light L is emitted through the substrate 20. Accordingly, the organic EL element 1A (organic EL panel 1) of this embodiment constitutes a bottom emission type.

The substrate 20 is a transparent substrate. In this embodiment, a glass substrate is used as the substrate. Further, a material for the glass substrate has a refractive index of 1.54 to the light having the wavelength of 550 nm.

Further, a concave and convex portion (scattering portion) 21 is provided in a position corresponding to the blue pixel XB on a surface 20a of the substrate 20 between the substrate 20 and the luminescent functional layer 110. That is, the concave and convex portion 21 is provided in the blue pixel XB selected from the unit pixel group Px. Here, "the position corresponding to the blue pixel XB" means a position where the blue pixel XB and the concave and convex portion 21 overlap each other, when being viewed from a direction vertical to the actual display region 4 of the organic EL element 1A. Further, in other words, such a concave and convex portion 21 is a portion formed on the surface 20a of the substrate 20 between the substrate 20 and the luminescent functional layer 110 (which will be described below).

In a method (step of forming a scattering portion) of forming such a concave and convex portion 21, the surface 20a of the glass substrate 20 is coated with positive resist and baked, and only the portion corresponding to the blue pixel XB is irradiated with ultraviolet rays using a mask for exposure processing, and is further subjected to development processing. This causes the portions corresponding to the green pixel XG and the red pixel XR to be coated with resist, and causes the portion of the surface 20a corresponding to the blue pixel XB to be exposed. Then, the concave and convex portion 21 which has a number of random irregularities with a height of 0.01 to 0.5 μm is formed only on the portion of the surface 20a corresponding to the blue pixel XB by performing hydrofluoric acid treatment which exposes the glass substrate 20 to chemicals of a hydrofluoric acid group. Thereafter, the rest of the resist is peeled off.

Further, in the substrate 20, a planarizing layer 22 is formed on the entire surface 20a including the concave and convex portion 21. In other words, the planarizing layer 22 is provided between the substrate 20 and the pixel electrode 23. This causes the surface 20a of the substrate 20 to be leveled. As a result, the planarizing layer 22 makes irregularities of the surface 20a of the substrate 20 flat to control display defects of the organic EL element 1A.

Such a planarizing layer 22, which is a layer film made of polymer resin, has a refractive index of 1.80 to the light with a wavelength of 550 nm, and is different from the refractive index of the glass substrate 20. Further, the difference between the refractive indexes is 0.26.

A method of forming such a planarizing layer is performed by coating polymer resin using a spin coat method. Further, after the coating, the polymer resin is cured by heat treatment or ultraviolet irradiation.

The pixel electrode 23 is a transparent conductive film, such as of ITO (Indium Tin Oxide) and IZO (Indium zinc Oxide), or compound oxides of tin oxide, indium oxide, and zinc oxide. The ITO film is adopted in this embodiment. The ITO film has a refractive index of 1.82 to the light with a wavelength of 550 nm.

As the method of forming such a pixel electrode 23, pixel electrodes 23 are patterned corresponding to the red pixel XR, the green pixel XG, and the blue pixel XB, respectively, by forming a transparent conductive film on the entire surface on the substrate 20 by a sputtering method, and thereafter performing wet etching treatment with a resist mask therebetween.

The luminescent functional layer 110 is configured such that a hole transport layer (luminescent functional layer) 70 formed on pixel electrodes 23, an organic EL layer (luminescent functional layer) 60 formed on the hole transport layer 70, and an electron transport layer (luminescent functional layer) 55 formed on the organic EL layer 60 are laminated.

The hole transport layer 70 is a layer film having a function to transport/inject electron holes into the organic EL layer 60. As materials for forming the hole transport layer 70, particularly, as high-molecular-weight materials, a dispersion solution of 3,4-polyethylenedioxythiophene/polystyrenesulfonic acid (PEDOT/PSS), that is, a dispersion solution in which 3,4-polyethylenedioxythiophene is dispersed in polystyrenesulfonic acid as a dispersion medium and the resulting mixture is then dispersed in water is suitably used.

In addition, materials for forming the hole transport layer 70 are not limited to the above-mentioned material, but various materials may be used. For example, materials obtained by dispersing polystyrene, polypyrrole, polyaniline, polyacetylene, or its derivatives in a suitable dispersion medium, such as polystyrenesulfonic acid described above, may be used. As low-molecular-weight materials, common hole injection materials, such as copper phthalocyanine, m-MTDATA, TPD, and α-NPD, can be used by the vapor deposition method.

As materials for forming the organic EL layer 60, known luminescent materials capable of emitting fluorescent light or phosphorescent light are used. Further, an organic EL element capable of performing a full color display is formed by providing organic EL layers 60R, 60G, and 60B in the red pixel XR, the green pixel XG, and the blue pixel XB, respectively.

As materials for forming the organic EL layer 60 (60R, 60G, and 60B), specifically, as high-molecular-weight materials, (poly)fluorene derivatives (PF), (poly)paraphenylenevinylene derivatives (PPV), polyphenylene derivatives (PP), polyparaphenylene derivatives (PPP), polyvinylcarbazole (PVK), polythiophene derivatives, or a polysilane-based material, such as polymethylphenylsilane (PMPS), are suitably used. Further, materials can be used that are obtained by doping high-molecular-weight materials, such as perylene-based pigments, coumarin-based pigments, and rhodamine-based pigments, or low-molecular-weight materials, such as rubrene, perylene, 9,10-diphenylanthracene, tetraphenylbutadiene, Nile red, coumalin 6, and quinacridone into these high-molecular-weight materials. As low-molecular-weight materials, host materials themselves, such as $Alq_3$ and DPVBi, and materials obtained by doping Nile red, DCM, rubrene, perylene, rhodamine, etc. into the host materials can be used by the vapor deposition method.

Further, as materials for forming the red organic EL layer 60R, for example, MEHPPV (poly(3-methoxy 6-(3-ethylhexyl) paraphenylenevinylene)) may be used. As materials for forming the green organic EL layer 60G, for example, a mixed solution of polydioctylfluorene and F8BT alternating copolymer of dioctylfluorene and benzothiadiazole) may be used. As materials for forming the blue organic EL layer 60B, for example, polydioctylfluorene may be used.

The electron transport layer 55 is a layer film having a function to transport/inject electrons into the organic EL layer 60. As materials for forming such an electron transport layer 55, for example, alkaline earth metals, such as LiF and $SrF_2$, and compounds of alkaline metals are adopted.

The negative electrode 50 is a common electrode which faces pixel electrodes 23R, 23G, and 23B. The negative electrode 5Q consists of a first negative electrode made of metals having a low work function, which is provided on the organic EL layer 60, and a second negative electrode that is provided on the first negative electrode to protect the first negative electrode. As the metals having a low work function, which forms the first negative electrode, metals whose work function is 3.0 eV or less are preferable, specifically, Ca (work function; 2.6 eV), Sr (work function; 2.1 eV), and Ba (work function; 2.5 eV) are used suitably. The second negative electrode is provided in order to cover the first negative electrode to protect it from oxygen, moisture, etc. and increase the conductivity of the whole negative electrode 50. Since the organic EL element 1A of this embodiment is of a bottom emission type that luminescent light is extracted from the substrate 20 side, aluminum, etc. that is a non-transparent and reflective metal is adopted as the negative electrode 50.

In addition, a sealing layer may be provided on the surface of the negative electrode. As the sealing layer, a passivation film, such as a silicon nitride oxide film, which is coated on the negative electrode 50, is adopted. This can kept moisture or oxygen from entering the luminescent functional layer 110.

In addition, in the unit pixel group Px which has the above configuration, a bank (partition wail) may be formed between the red pixel XR, the green pixel XG, and the blue pixel XB.

In this case, the luminescent functional layer made of high-molecular-weight materials can be formed by a droplet discharge method. Further, it is preferable that the bank be composed of a bank made of an inorganic material, and an organic bank made of an organic material. Moreover, it is preferable that a lyophilic property be given to the surface of the inorganic bank, and a lyophobic property be given to the surface of the organic bank. This enables droplets to be detained between the banks when the luminescent functional layer 110 is formed by a droplet discharge method.

Further, the above luminescent functional layer 110 may be made of low-molecular-weight materials. In this case, since the luminescent functional layer is formed using a mask vapor deposition method, it is not necessary to form a bank. Further, it is preferable that a hole transport layer and an electron injection buffer layer be included as the luminescent functional layer of a low molecule group.

In the organic EL element 1A configured in this way, if a current flows between the pixel electrode 23 and the negative electrode 50, the organic EL layer 60 (60B, 60G, 60R) emits light, and the luminescent light L is emitted from the substrate 20 directly through the pixel electrode 23, or is reflected by the negative electrode 50 and then emitted from the substrate 20 through the pixel electrode 23. At this time, in the blue pixel XB where the concave and convex portion 21 is formed, the interference light which has various kinds of optical path length is scattered by the concave and convex portion 21 when it enters the substrate 20.

Accordingly, since interference light beams which have various kinds of optical path length, i.e., interference light beams of various colors, coexist and are randomly radiated to an air interface as described above, any color shift or luminance decrease when the organic EL element 1A is viewed from an oblique direction (wide angle) can be suppressed.

TABLE 1

|  | 0° | 45° |
|---|---|---|
| First Embodiment | 100% | 63.54% |
| Example of Related Art | 100% | 25.23% |

Table 1 shows the results when the organic EL element 1A of this embodiment is compared with an organic EL element of related art for the relative luminance in a case in which the luminescent light of the blue pixel XB is observed from the front face or from an oblique direction.

The results of Table 1 are measurement results when only the blue pixel XB is caused to emit light, and other pixels are caused not to emit light.

In the following description, the "front face" means that luminescent light is observed from the direction vertical to the display surface of an organic EL element, and the "oblique direction" means that luminescent light is observed from the direction inclined by 45° from the direction vertical to the display surface of an organic EL element.

Further, the "relative luminance" means the ratio of a luminance in a case (45°) in which the display surface (actual display region) of an organic EL element is observed from the direction inclined by 45° to a luminance (100%) in a case (0°) in which the display surface is observed from the front face.

As can be clear from Table 1, the relative luminance is 25.23% in the example of related art which does not have such a concave and convex portion 21, whereas the relative luminance is 63.64% in this embodiment. Accordingly, it was confirmed that a decrease in the luminance of the blue pixel XB is suppressed in this embodiment. Further, it was confirmed that any color shift is suppressed by suppressing a luminance decrease.

In addition, although this embodiment has been described in conjunction with the case in which a number of irregularities are formed on the surface 20a of the glass substrate 20 using hydrofluoric acid treatment in forming the concave and convex portion 21, a convex portion (concave and convex portion) may be additionally formed only on the portion of the surface 20a corresponding to the blue pixel XB by $SiO_2$ (silicon oxide), SiN (silicon nitride), acrylic resin (resin layer), etc.

Specifically, when $SiO_2$ or SiN is additionally formed on the surface 20a, for example, a method of patterning a convex portion of $SiO_2$ or SiN on the portion of the surface 20a corresponding to the blue pixel XB in the substrate 20 by using the mask sputtering method and the mask vapor deposition method is adopted.

Further, when acrylic resin is additionally formed, for example, a method of patterning a convex portion of acrylic resin only on the portion of the surface 20a corresponding to the blue pixel XB in the substrate 20 by forming a photocurable resin layer on the entire surface 20a, and thereafter irradiating it with exposing right via an exposure mask to perform development processing is adopted.

Further, although this embodiment has been described in conjunction with the case in which the planarizing layer 22 is formed on the entire surface of the substrate 20, the planarizing layer 22 may be formed only on the concave and convex portion 21 to planarize the concave and convex portion 21. In this case, the planarizing layer 22 can be formed only in the blue pixel XB in which the concave and convex portion 21 is formed by performing masking processing, such as covering the substrate 20 with a surface protection tape etc., before the planarizing layer 22 is coated.

Further, this embodiment can also be applied to a case n which a half mirror, a dielectric multilayer, etc. is provided within the organic EL element 1A, for example, provided between the pixel electrode 23 and the planarizing layer 22. In the case in which a half mirror or a dielectric multilayer is included as such, interference of luminescent light is easily caused and consequently color shift is apt to occur, but the color shift and the luminance decrease can be suppressed by providing the concave and convex portion 21 as described above to scatter luminescent light.

TABLE 2

|  | $\Delta n$ | | | | | | | | | |
|---|---|---|---|---|---|---|---|---|---|---|
|  | 0 | ±0.01 | ±0.03 | ±0.05 | ±0.07 | ±0.08 | ±0.09 | ±0.1 | ±0.03 | ±0.5 |
| Relative luminance | 25.23% | 25.88% | 26.77% | 28.22% | 28.96% | 59.94% | 91.23% | 91.99% | 63.34% | 68.28% |

Table 2 shows the relative luminance when the emitting light of the blue pixel XB is observed from an oblique direction (45°) about the case in which the refractive index difference between the planarizing layer 22 and the substrate 20 in this embodiment is changed.

Further, in Table 2, "$\Delta n$" means the refractive index difference between the glass substrate 20 and the planarizing layer 22. Further, in Table 2, that $\Delta n$ is "0" shows an organic EL element of related art, and means a case in which the concave and convex portion 21 is not formed.

Figure 4:
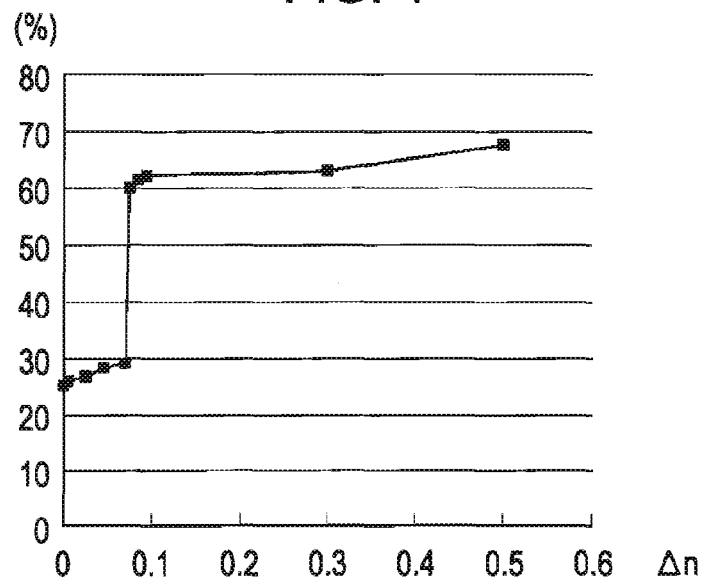
FIG. 4 is a view for explaining the relative luminance of the organic EL element related to the first embodiment of the invention.

Further, FIG. 4 shows a graph obtained on the basis of Table 2, in which "$\Delta n$" is plotted on an axis of abscissa and relative luminance is plotted on an axis of ordinate.

As can be clear from Table 2 and FIG. 4, when the refractive Index difference between the planarizing layer 22 and the substrate 20 is 0.08 or more, it can be understood that the relative luminance observed from a 45° viewing angle becomes about 60% or more. It was confirmed that a decrease in the luminance of the blue pixel XB is suppressed by forming the concave and convex portion 21 and setting the refractive index difference between the planarizing layer 22 and the substrate 20 to 0.08 or more in this way. Further, it was confirmed that any color shift is suppressed by suppressing a luminance decrease. Further, it was confirmed that the same effects can be obtained even if $\Delta n$ is a positive value or a negative value.

Second Embodiment of Organic EL Element

Next, a second embodiment of the organic EL element will be described.

This embodiment is different from the first embodiment in that a concave and convex portion 21 is provided in a position corresponding to the green pixel XG. Further, since other components are the same as those of the first embodiment, they are denoted by the same reference numerals, and the description thereof is omitted.

In this embodiment, the concave and convex portion 21 is provided in the position corresponding to the green pixel XG on the surface 20a of the substrate 20. That is, the concave and convex portion 21 is provided in the green pixel XG selected from the unit pixel group Px. Here, "the position corresponding to the green pixel XG" means a position where the green pixel XG and the concave and convex portion 21 overlap each other, when being viewed from a direction vertical to the actual display region 4 of the organic EL element 1A. The method of forming such a concave and convex portion 21 is the same as that of the first embodiment, and the concave and convex portion 21 which has a number of random irregularities with a height of 0.01 to 0.5 μm is formed only on the portion of the surface 20a corresponding to the green pixel XG.

Further, the organic EL layer 60G of the green pixel XG is made of high-molecular-weight materials of a polyphenylene vinylene group. Such materials have an emission spectrum peak in a slightly yellow region. Therefore, in a structure in which a green (around 550 nm) light beam is extracted to the front face, when an organic EL panel is observed from an oblique direction other than the front face, an interference peak may shift to a short wavelength due to interference within a layer structure, and an interference peak comes to a wavelength with weak emission intensity. As a result, the organic EL panel has characteristics that it is hard to extract light of around 550 nm.

In this embodiment, if the organic EL layer 60 (60B, 60G, 60R) emits light, the luminescent light L is emitted from the substrate 20 directly through the pixel electrode 23, or is reflected by the negative electrode 50 and then emitted from the substrate 20 through the pixel electrode 23. At this time, in the green pixel XG where the concave and convex portion 21 is formed, the interference light which has various kinds of optical path length is scattered by the concave and convex portion 21 when it enters the substrate 20.

Accordingly, since interference light beams which have various kinds of optical path length, i.e., interference light beams of various colors, coexist and are randomly radiated to an air interface as described above, any color shift or luminance decrease when the organic EL element 1A is viewed from an oblique direction (wide angle) can be suppressed.

As a result, although the organic EL layer 60G is made of high-molecular-weight materials, the light of around 550 nm can be extracted when being observed from an oblique direction.

TABLE 3

|  | 0° | 45° | Color Difference Δu'v' |
|---|---|---|---|
| Second Embodiment | (0.405, 0.575) | (0.422, 0.566) | 0.010 |
| Example of Related Art | (0.403, 0.582) | (0.454, 0.552) | 0.033 |

Table 3 shows the results when the organic EL element 1A of this embodiment is compared with an organic EL element of related art for the color coordinate (x, y) and color difference Δu'v') in a case in which the luminescent light of the green pixel XG is observed from the front face or from an oblique direction.

The results of Table 3 are measurement results when only the green pixel XG is caused to emit light, and other pixels are caused not to emit light.

Generally, the color difference having a value of 0.02 or more means that the change of a color is a color change which can be recognized by an observer, and any color shift is observed conspicuously. On the other hand, the color difference having a value lower than 0.02 means that the change of a color is small.

As shown in Table 3, the color coordinate (x, y) of the green light in an example of related art became (0.403, 0.582) in a case (0°) in which the light is observed from the front face, and the color coordinate became (0.454, 0.552) in a case (45°) in which the light is observed from an oblique direction. As a result, the color difference became 0.033.

In contrast, the color coordinate (x, y) of the green light in this embodiment became (0.405, 0.575) in a case (0°) in which the light is observed from the front face, and the color coordinate became (0.422, 0.566) in a case (45°) in which the light is observed from an oblique direction. As a result, the color difference became 0.010.

Accordingly, as can be clear from Table 3, as compared with the example of related art which does not have a concave and convex portion 21, the color shift when being observed from a wide angle is greatly reduced in this embodiment.

Third Embodiment of Organic EL Element

Next, a third embodiment of the organic EL element will be described.

This embodiment is different from the first embodiment in that concave and convex portions 21 are provided in positions corresponding to the green pixel XG and the blue pixel XB. Further, since other components are the same as those of the first embodiment, they are denoted by the same reference numerals, and the description thereof is omitted.

In this embodiment, the concave and convex portions 21 are provided in the positions corresponding to the green pixel XG and the blue pixel XB on the surface 20a of the substrate 20. That is, the concave and convex portions 21 are provided in the green pixel XG and the blue pixel XB selected from the unit pixel group Px. Here, "the positions corresponding to the green pixel XG and the blue pixel XB" means positions where the green pixel XG and the blue pixel XB, and the concave and convex portion 21 overlap each other, when being viewed from a direction vertical to the actual display region 4 of the organic EL element 1A. The method of forming such concave and convex portions 21 is the same as that of the first embodiment, and the concave and convex portions 21 which have a number of random irregularities with a height of 0.01 to 0.5 μm are formed only on the portions of the surface 20a corresponding to the green pixel XG and the blue pixel XB.

In this embodiment, if the organic EL layer 60 (60B, 60G, 60R) emits light, the luminescent light L is emitted from the substrate 20 directly through the pixel electrode 23, or is reflected by the negative electrode 50 and then emitted from the substrate 20 through the pixel electrode 23. At this time, in the green pixel XG and the blue pixel XB where the concave and convex portions 21 are formed, the interference light which has various kinds of optical path length is scattered by the concave and convex portions 21 when it enters the substrate 20.

Accordingly, since interference light beams which have various kinds of optical path length, i.e., interference light beams of various colors, coexist and are randomly radiated to an air interface as described above, any color shift or luminance decrease when the organic EL element 1A is viewed from an oblique direction (wide angle) can be suppressed.

TABLE 4

|  | 0° | 45° | Color Difference Δu'v' |
|---|---|---|---|
| Third Embodiment | (0.33, 0.33) | (0.34, 0.35) | 0.007 |
| Example of Related Art | (0.33, 0.33) | (0.42, 0.41) | 0.032 |

Table 4 shows the results when the organic EL element 1A of this embodiment is compared with an organic EL element of related art for the color coordinate (x, y) and color difference (Δu'v') in a case in which the white light when the unit pixel group Px is caused to totally emit light is observed from the front face or from an oblique direction.

As shown in Table 4, the color coordinate (x, y) of the white light in an example of related art became (0.33, 0.33) in a case (0°) in which the light is observed from the front face, and the color coordinate became (0.42, 0.41) in a case (45°) in which the light is observed from an oblique direction. As a result, the color difference became 0.032. In such an example of related art, when being observed from an oblique direction, any color shift of green light may be caused, or the luminance of blue light may decrease, which result in yellow-based white light that is reddish as a whole.

In contrast, the color coordinate (x, y) of the green light in this embodiment became (0.33, 0.33) in a case (0°) in which the light is observed from the front face, and the color coordinate became (0.34, 0.35) in a case (45°) in which the light is observed from an oblique direction. As a result, the color difference became 0.007. In such an embodiment, it was confirmed that discoloration of the white light is hardly caused even when being observed from the front face or from an oblique direction.

As can be clear from Table 4, as compared with the example of related art which does not have a concave and convex portion 21, the color shift when being observed from a wide angle is greatly reduced in this embodiment.

Fourth Embodiment of Organic EL Element

Next, a fourth embodiment of the organic EL element which constitutes the organic EL panel 1 will be described.

Figure 5:
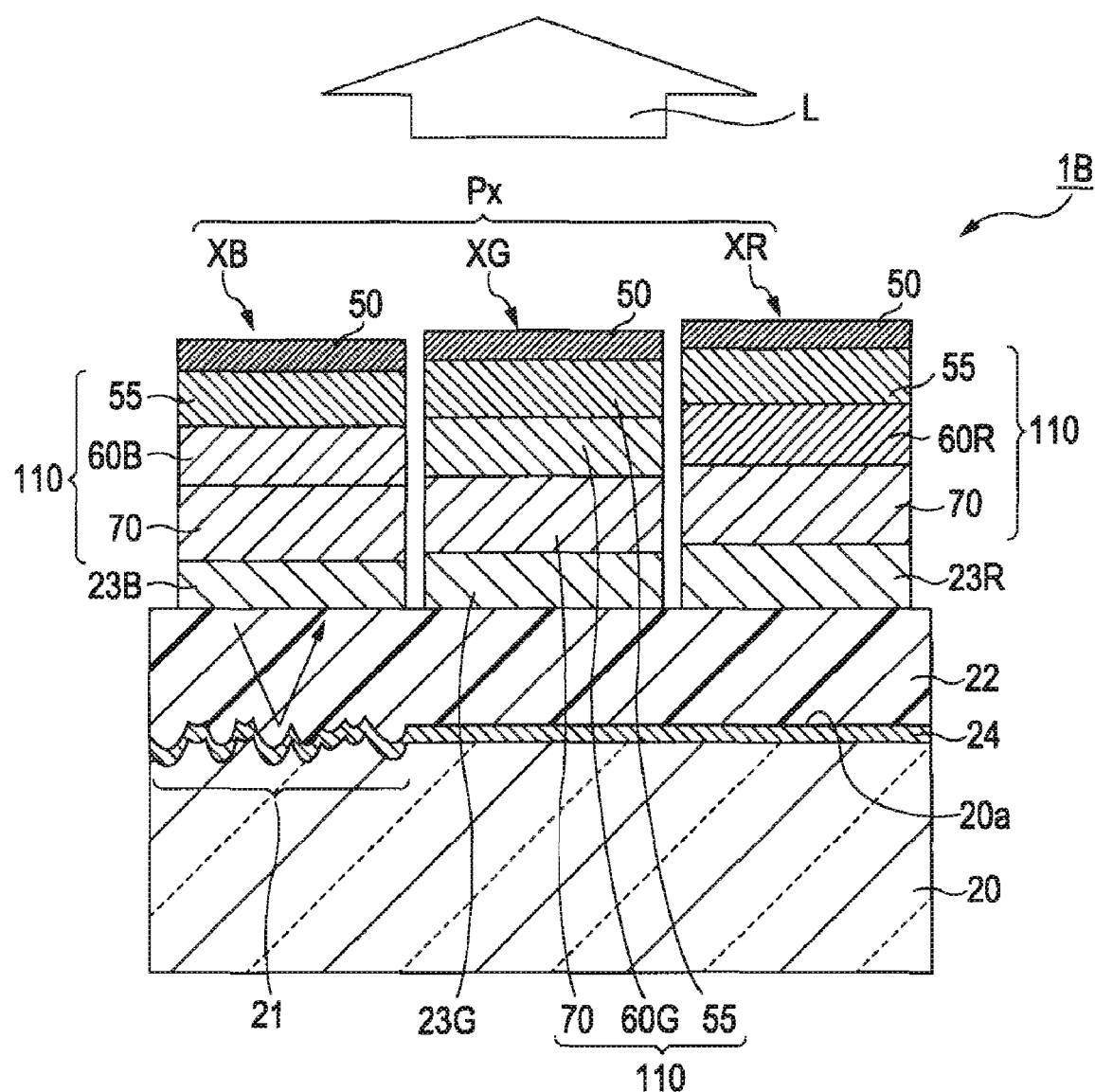
FIG. 5 is a sectional view schematically showing the configuration of an organic EL element related to a fourth embodiment of the invention.

FIG. 5 is a sectional view schematically showing the configuration of an organic EL element 1B of this embodiment.

This embodiment is different from the previous embodiment in that it has a top emission structure which extracts emitting light of the luminescent functional layer 110 through the negative electrode 50. In the following description, the same components as those of the previous embodiment are denoted by the same reference numerals, and the description thereof is omitted.

In the organic EL element (organic EL device) 1B of this embodiment, a reflective layer 24 is formed on the entire surface 20a of the substrate 20 including the concave and convex portion 21, and the concave and convex portion 21 is formed in a position corresponding to the blue pixel XB on the surface 20a of the substrate 20. That is, the concave and convex portion 21 is provided in the blue pixel XB selected from the unit pixel group Px. Thereby, the reflective layer 24 has a convexo-concave surface in imitation of the shape of the concave and convex portion 21 in the blue pixel XB, and functions as a scattering portion of the invention. As materials for such a reflective layer 24, light reflective metals, such as silver (Ag) and aluminum, are adopted.

Accordingly, the light which is emitted in each of the red pixel XR, the green pixel XG, and the blue pixel XE is emitted not only to the opposite side of the substrate 20 through the negative electrode 50, but also reflected by the reflective layer 24 and then emitted as luminescent light L to the opposite side to the substrate 20 through the negative electrode 50. In the green pixel XG and the red pixel XE, the luminescent light is reflected toward the negative electrode 50 by the flat reflective layer 24, whereas in the blue pixel XB, the luminescent light is scattered and reflected by the convexo-concave reflective layer 24.

Since such an organic EL element LB is of a top emission type, and has a structure in which luminescent light is extracted light from the negative electrode 50, ITO of a transparent conductive film is adopted as a material for the negative electrode 50. Further, the pixel electrode 23 is constituted of the pixel electrode 23R formed in the red pixel XR, the pixel electrode 23G formed in the green pixel XG, and the pixel electrode 23B formed in the blue pixel XB. The pixel electrodes 23R, 23G, and 23B are different in film thickness from each other, and the film thickness satisfies the following large and small relation: pixel electrode 23R >pixel electrode 23G> pixel electrode 23B. In this way, since the pixel electrodes 23R, 23G, and 23B have transparency along with different film thicknesses, they can be allowed to function as optical resonators. That is, it is possible to make (adjust) the optical length of optical resonators different for every pixel electrode 23R, 23G, or 23B. For example, the film thickness of a pixel electrode 23R of a pixel which emits light with long wavelength (for example, red light) is reduced, so that the optical length can be adjusted, and the film thickness of a pixel electrode 23B of a pixel which emits light with short wavelength for example, blue light) is reduced, so that the optical length can be adjusted.

Otherwise, it is also possible to form pixels by making materials for the luminescent layers XR, XG, and XE different from each other, without changing the film thickness of the pixel electrodes 23R, 23G, and 23B.

Further, a planarizing layer 22 is formed on the entire surface of the reflective layer 24. This causes the surface 20a of the substrate 20 to be leveled. As a result, the planarizing layer 22 makes irregularities of the surface 20a of the substrate 20 flat to control display defects of the organic EL element 1B.

In this embodiment, if the organic EL layer 60 (60B, 60G, 60R) emits light, the luminescent light L is emitted directly through the pixel electrode 50, or is reflected by the reflective layer 24 and then emitted through the pixel electrode 23 and the negative electrode 50. At this time, in the blue pixel XB where the reflective layer 24 is formed, the interference light which has various kinds of optical path length is scattered and reflected by the reflective layer 24.

Accordingly, since interference light beams which have various kinds of optical path length, i.e., interference light beams of various colors, coexist and are randomly radiated to an air interface as described above, any color shift or luminance decrease when the organic EL element 1B is viewed from an oblique direction (wide angle) can be suppressed.

TABLE 5

|  | 0° | 45° |
|---|---|---|
| Fourth Embodiment | 100% | 65.75% |
| Example of Related Art | 100% | 28.54% |

Table 5 shows the results when the organic EL element 1B of this embodiment is compared with an organic EL element of related art for the relative luminance in a case in which the luminescent light of the blue pixel XB is observed from the front face or from an oblique direction.

The results of Table 5 are measurement results when only the blue pixel XB is caused to emit light, and other pixels are caused not to emit light.

As can be clear from Table 5, the relative luminance is 28.54% in the example of related art which does not have such a concave and convex portion 24, whereas the relative luminance is 65.75% in this embodiment. Accordingly, it was confirmed that a decrease in the luminance of the blue pixel XB is suppressed in this embodiment. Further, it was confirmed that any color shift is suppressed by suppressing a luminance decrease.

Fifth Embodiment of Organic EL Element

Next, a fifth embodiment of the organic EL element will be described.

This embodiment is different from the fourth embodiment in that the convexo-concave reflective layer 24 is formed in the green pixel XG. Further, since other components are the same as those of the fourth embodiment, they are denoted by the same reference numerals, and the description thereof is omitted.

In this embodiment, the concave and convex portion 21 is provided in the position corresponding to the green pixel XG on the surface 20a of the substrate 20. That is, the concave and convex portion 21 is provided in the green pixel XG selected from the unit pixel group Px. The method of forming such a concave and convex portion 21 is the same as that of the first embodiment, and the concave and convex portion 21 which has a number of random irregularities with a height of 0.01 to 0.5 μm is formed only on the portion of the surface 20a corresponding to the green pixel XG.

Further, since the reflective layer is formed 24 in imitation of the concave and convex portion 21, the reflective layer 24 scatters and reflects the luminescent light of the green pixel XC.

In this embodiment, if the organic EL layer 60 (60B, 60G, 60R) emits light, the luminescent light L is emitted directly through the pixel electrode 50, or is reflected by the reflective layer 24 and then emitted through the pixel electrode 23 and the negative electrode 50. At this time, in the green pixel XG where the reflective layer 24 is formed, the interference light which has various kinds of optical path length is scattered and reflected by the reflective layer 24.

Accordingly, since interference light beams which have various kinds of optical path length, i.e., interference light beams of various colors, coexist and are randomly radiated to an air interface as described above, any color shift or luminance decrease when the organic EL element 1B is viewed from an oblique direction (wide angle) can be suppressed.

As a result, although the organic EL layer 60G is made of high-molecular-weight materials, the light of around 550 nm can be extracted when being observed from an oblique direction.

TABLE 6

| | 0° | 45° | Color Difference Δu'v' |
|---|---|---|---|
| Fifth Embodiment | (0.220, 0.652) | (0.210, 0.620) | 0.008 |
| Example of Related Art | (0.229, 0.682) | (0.205, 0.565) | 0.030 |

Table 6 shows the results when the organic EL element 1B of this embodiment is compared with an organic EL element of related art for the color coordinate (x, y) and color difference (Δu'v') in a case in which the luminescent light of the green pixel XG is observed from the front face or from an oblique direction.

The results of Table 6 are measurement results when only the green pixel XG is caused to emit light, and other pixels are caused not to emit light.

As shown in Table 6, the color coordinate (x, y) of the green light in an example of related art became (0.229, 0.682) in a case (0°) in which the light is observed from the front face, and the color coordinate became (0.205, 0.565) in a case (45°) in which the light is observed from an oblique direction. As a result, the color difference became 0.030.

In contrast, the color coordinate (x, y) of the green light in this embodiment became (0.220, 0.652) in a case (0°) in which the light is observed from the front face, and the color coordinate became (0.210, 0.620) in a case (45°) in which the light is observed from an oblique direction. As a result, the color difference became 0.008. That is, in this embodiment, since the color difference becomes smaller than 0.02, any color shift is not recognized by an observer.

Accordingly, as can be clear from Table 6, as compared with the example of related art which does not have a convexo-concave reflective layer 24, the color shift when being observed from a wide angle is greatly reduced in this embodiment.

Sixth Embodiment of Organic EL Element

Next, a sixth embodiment of the organic EL element will be described.

This embodiment is different from the fourth embodiment in that the convexo-concave reflective layer 24 is formed in the green pixel XG and the blue pixel XB. Further, since other components are the same as those of the fourth embodiment, they are denoted by the same reference numerals, and the description thereof is omitted.

In this embodiment, the concave and convex portions 21 are provided in the positions corresponding to the green pixel XG and the blue pixel XE on the surface 20a of the substrate 20. That is, the concave and convex portions 21 are provided in the green pixel XG and the blue pixel XB selected from the unit pixel group Px. The method of forming such concave and convex portions 21 is the same as that of the first embodiment, and the concave and convex portions 21 which have a number of random irregularities with a height of 0.01 to 0.5 μm are formed only on the portions of the surface 20a corresponding to the green pixel XG and the blue pixel XE.

Further, since the reflective layer 24 is formed in imitation of the concave and convex portions 21, the reflective layer 24 scatters and reflects the luminescent light of the green pixel XG and the blue pixel XB.

In this embodiment, if the organic EL layer 60 (60B, 60G, 60R) emits lights, the luminescent light L is emitted directly through the pixel electrode 50, or is reflected by the reflective layer 24 and then emitted through the pixel electrode 23 and the negative electrode 50. At this time, in the green pixel XG and the blue pixel XB where the reflective layer 24 is formed, the interference light which has various kinds of optical path length is scattered and reflected by the reflective layer 24.

Accordingly, since interference light beams which have various kinds of optical path length, i.e., interference light beams of various colors, coexist, and are randomly radiated to an air interface as described above, any color shift or luminance decrease when the organic EL element 1B is viewed from an oblique direction (wide angle) can be suppressed.

TABLE 7

|  | 0° | 45° | Color Difference Δu'v' |
|---|---|---|---|
| Sixth Embodiment | (0.33, 0.33) | (0.337, 0.345) | 0.009 |
| Example of Related Art | (0.33, 0.33) | (0.38, 0.36) | 0.032 |

Table 7 shows the results when the organic EL element 1B of this embodiment is compared with an organic EL element of related art for the color coordinate (x, y) and color difference (Δu'v') in a case in which the white light when the unit pixel group Px is caused to totally emit light is observed from the front face or from an oblique direction.

As shown in Table 7, the color coordinate (x, y) of the white light in an example of related art became (0.33, 0.33) in a case (0°) in which the light is observed from the front face, and the color coordinate became (0.38, 0.36) in a case (45°) in which the light is observed from an oblique direction. As a result, the color difference became 0.032. In such an example of related art, when being observed from an oblique direction, any color shift of green light may be caused, or the luminance of blue light may decrease, which result in yellow-based white light that is reddish as a whole.

In contrast, the color coordinate (x, y) of the green light in this embodiment became (0.33, 0.33) in a case (0°) in which the light is observed from the front face, and the color coordinate became (0.337, 0.345) in a case (45°) in which the light is observed from an oblique direction. As a result, the color difference became 0.009. In such an embodiment, it was confirmed that discoloration of the white light is hardly caused even when being observed from the front face or from an oblique direction.

As can be clear from Table 7, as compared with the example of related art which does not have a convexo-concave reflective layer 24, the color shift when being observed from a wide angle is greatly reduced in this embodiment.

Seventh Embodiment of Organic EL Element

Next, a seventh embodiment of the organic EL element which constitutes the organic EL panel 1 will be described.

Figure 6:
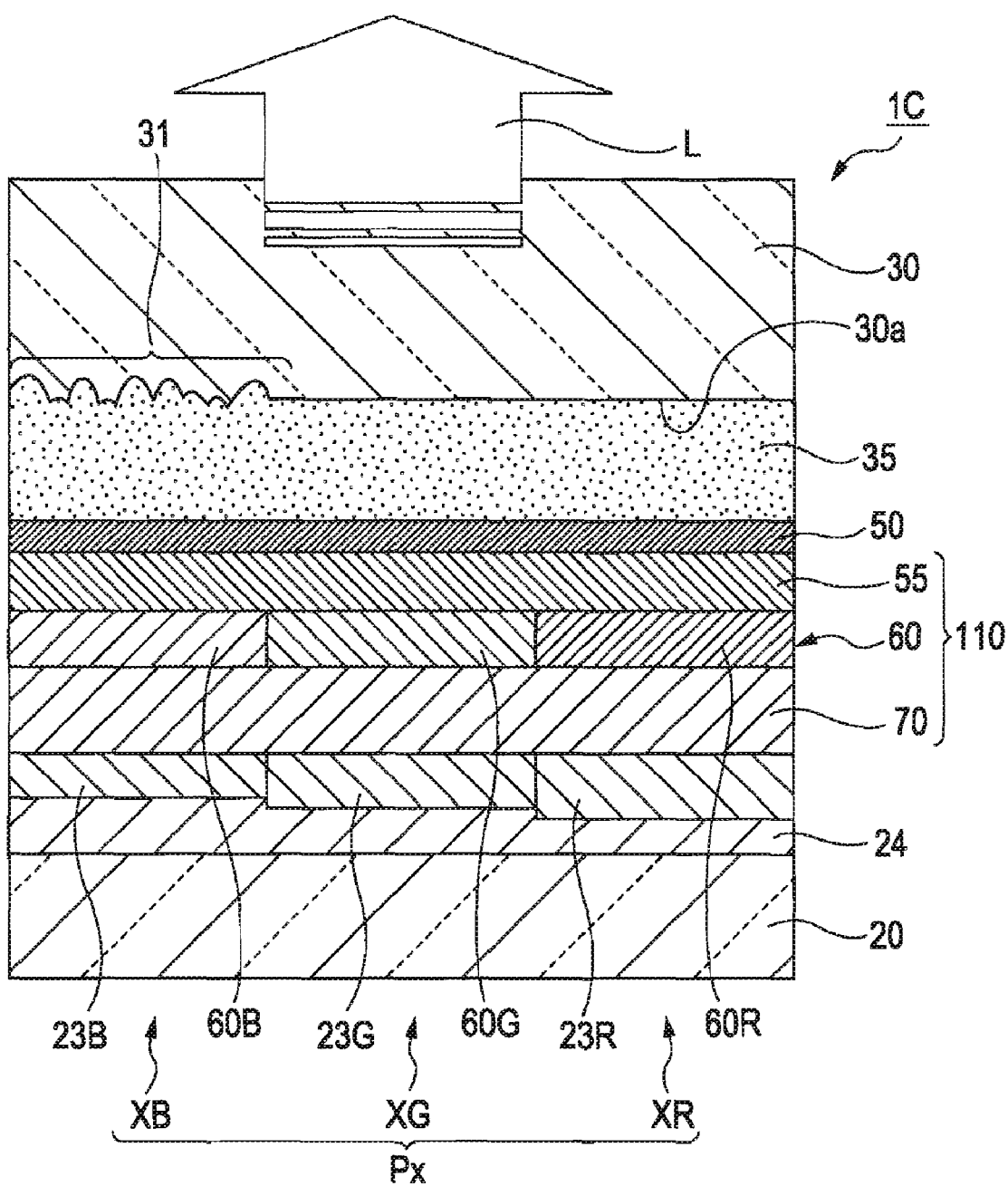
FIG. 6 is a sectional view schematically showing the configuration of an organic EL element related to a seventh embodiment of the invention.

FIG. 6 is a sectional view schematically showing a unit pixel group of an organic EL element 1C of this embodiment.

This embodiment is different from the previous embodiment in that it has a top emission structure including a counter substrate. In the following description, the same components as those of the previous embodiment are denoted by the same reference numerals, and the description thereof is omitted.

The organic EL element (organic EL device) 1C of this embodiment includes a counter substrate 30 arranged to face the substrate 20 and a bonding layer 35 which bonds the substrate 20 and the counter substrate 30 together. Also, the luminescent functional layer 110 sandwiched by the above-mentioned pixel electrode 23 and a negative electrode 50 is formed between the substrate 20 and the counter substrate 30.

Here, since the counter substrate 30 is a substrate which constitutes a top emission type organic EL panel, transparent substrates, such as a glass substrate, are adopted. On this embodiment, a glass substrate which has the same refractive index (a refractive index of 1.54 to the light with a wavelength of 550 nm) as the substrate 20 is adopted as the counter substrate 30.

Further, a concave and convex portion (scattering portion) 31 is provided in a position corresponding to the blue pixel XB on a surface 30a of the counter substrate 30 between the counter substrate 30 and the luminescent functional layer 110. That is, the concave and convex portion 31 is provided in the blue pixel XB selected from the unit pixel group Px, Here, "the position corresponding to the blue pixel XB" means a position where the blue pixel XE and the concave and convex portion 31 overlap each other, when being viewed from a direction vertical to the actual display region 4 of the organic EL element 1C. Further, in other words, such a concave and convex portion 31 is a portion formed on the surface 30a of the counter substrate 30 between the counter substrate 30 and the luminescent functional layer 110 (which will be described below).

Further, a method of forming such a concave and convex portion 31 is the same as the method of forming the above-mentioned concave and convex portion 21. According to this method, a number of random concave and convex portions 31 with a height of 0.01 to 0.5 μm can be formed by performing hydrofluoric acid treatment to the surface 30a of the counter substrate 30.

The bonding layer 35 is a layer film made of resin filler, such as, for example, acrylics and epoxy. Further, the bonding layer 35 is filled up between both the substrates 20 and 30 by bonding the substrate 20 and the counter substrate 30 together after being coated on the surface of the negative electrode 50 of the substrate 20 so as to cover the surface or after being coated on the surface 30a of the counter substrate 30 so as to cover the surface.

Further, in the organic EL element 1C of this embodiment, the reflective film 24 is formed on the substrate 20, and the pixel electrode 23 (23B, 23G, 23R) is formed on the reflective film 24. Here, the pixel electrode 23 is not necessarily formed of a transparent conductive film, and may be a metallic reflective film. This allows the reflective film 24 to become unnecessary and the number of manufacturing processes to be reduced.

In this embodiment, if the organic EL layer 60 (60B, 60G, 60R) emits light, the luminescent light L is emitted directly through the negative electrode 50 and the counter electrode 30, or is reflected by the reflective layer 24 and then emitted through the negative electrode 50 and the counter electrode 30. At this time, in the blue pixel XB where the concave and convex portion 31 is formed, the interference light which has various kinds of optical path length is scattered by the concave and convex portion 31 when it enters the counter substrate 30.

Accordingly, since interference light beams which have various kinds of optical path length, i.e., interference light beams of various colors, coexist, and are randomly radiated to an air interface as described above, any color shift or luminance decrease when the organic EL element 1C is viewed from an oblique direction (wide angle) can be suppressed.

TABLE 8

|  | 0° | 45° |
|---|---|---|
| Seventh Embodiment | 100% | 60.28% |
| Example of Related Art | 100% | 28.54% |

Table 8 shows the results when the organic EL element 1C of this embodiment is compared with an organic EL element of related art for the relative luminance in a case in which the luminescent light of the blue pixel XB is observed from the front face or from an oblique direction.

The results of Table 8 are measurement results when only the blue pixel XB is caused to emit light, and other pixels are caused not to emit light. As can be clear from Table 8, the relative luminance is 28.54% in the example of related art which does not have such a concave and convex portion 31, whereas the relative luminance is 60.28% in this embodiment.

Accordingly, it was confirmed that a decrease in the luminance of the blue pixel XB is suppressed in this embodiment. Further, it was confirmed that any color shift is suppressed by suppressing a luminance decrease.

Eighth Embodiment of Organic EL Element

Next, an eighth embodiment of the organic EL element will be described.

This embodiment is different from the seventh embodiment in that a concave and convex portion 31 is provided in a position corresponding to the green pixel XG. Further, since other components are the same as those of the seventh embodiment, they are denoted by the same reference numerals, and the description thereof is omitted.

In this embodiment, the concave and convex portion 31 is provided in the position corresponding to the green pixel XG on the surface 30a of the counter substrate 30. That is, the concave and convex portion 31 is provided in the green pixel XG selected from the unit pixel group Px. A method of forming such a concave and convex portion 31 is the same as the method of forming the above-mentioned concave and convex portion 21. According to this method, a number of random concave and convex portions 31 with a height of 0.01 to 0.5 μm can be formed by performing hydrofluoric acid treatment to the surface 30a of the counter substrate 30.

In this embodiment, if the organic EL layer 60 (60B, 60G, 60R) emits light, the luminescent light L is emitted directly through the negative electrode 50 and the counter electrode 30, or is reflected by the reflective layer 24 and then emitted through the negative electrode 50 and the counter electrode 30. At this time, in the green pixel XG where the concave and convex portion 31 is formed, the interference light which has various kinds of optical path length is scattered by the concave and convex portion 31 when it enters the counter substrate 30.

Accordingly, since interference light beams which have various kinds of optical path length i.e., interference light beams of various colors, coexist, and are randomly radiated to an air interface as described above, any color shift or luminance decrease when the organic EL element 1C is viewed from an oblique direction (wide angle) can be suppressed.

As a result, although the organic EL layer 60G is made of high-molecular-weight materials, the light of around 550 nm can be extracted when being observed from an oblique direction.

TABLE 9

|  | 0° | 45° | Color Difference Δu'v' |
|---|---|---|---|
| Eighth Embodiment | (0.220, 0.652) | (0.213, 0.618) | 0.008 |
| Example of Related Art | (0.229, 0.682) | (0.205, 0.565) | 0.030 |

Table 9 shows the results when the organic EL element 1C of this embodiment is compared with an organic EL element of related art for the color coordinate (x, y) and color difference (Δu'v') in a case in which the luminescent light of the green pixel XG is observed from the front face or from an oblique direction.

The results of Table 9 are measurement results when only the green pixel XG is caused to emit light, and other pixels are caused not to emit light.

As shown in Table 9, the color coordinate (x, y) of the green light in an example of related art became (0.229, 0.682) in a case (0°) in which the light is observed from the front face, and the color coordinate became (0.205, 0.565) in a case (45°) in which the light is observed from an oblique direction. As a result, the color difference became 0.030.

In contrast, the color coordinate (x, y) of the green light in this embodiment became (0.220, 0.652) in a case (0°) in which the light is observed from the front face, and the color coordinate became (0.213, 0.618) in a case (45°) in which the light is observed from an oblique direction. As a result, the color difference became 0.008. That is, in this embodiment, since the color difference becomes smaller than 0.02, any color shift is not recognized by an observer.

Accordingly, as can be clear from Table 9, as compared with the example of related art which does not have a convexo-concave reflective layer 24, although the x value when being observed from the front face increases, and light is somewhat blue, the color shift when being observed from a wide angle is greatly reduced in this embodiment.

Ninth Embodiment of Organic EL Element

Next, a ninth embodiment of the organic EL element will be described.

This embodiment is different from the seventh embodiment in that the convexo-concave reflective layer 24 is formed in the green pixel XG and the blue pixel XB. Further, since other components are the same as those of the seventh embodiment, they are denoted by the same reference numerals, and the description thereof is omitted.

In this embodiment, the concave and convex portions 31 are provided in the positions corresponding to the green pixel XG and the blue pixel XB on the surface 30a of the counter substrate 30. That is, the concave and convex portions 31 are provided in the green pixel XG and the blue pixel XB selected from the unit pixel group Px. A method of forming such a concave and convex portion 31 is the same as the method of forming the above-mentioned concave and convex portion 21. According to this method, a number of random concave and convex portions 31 with a height of 0.01 to 0.5 μm can be formed by performing hydrofluoric acid treatment to the surface 30a of the counter substrate 30.

In this embodiment, if the organic EL layer 60 (60B, 60G, 60R) emits light, the luminescent light L is emitted directly through the negative electrode 50 and the counter electrode 30, or is reflected by the reflective layer 24 and then emitted through the negative electrode 50 and the counter electrode 30. At this time, in the green pixel XG and the blue pixel XE where the concave and convex portions 31 are formed, the interference light which has various kinds of optical path length is scattered by the concave and convex portions 31 when it enters the counter substrate 30.

Accordingly, since interference light beams which have various kinds of optical path length, i.e., interference light beams of various colors, coexist, and are randomly radiated to an air interface as described above, any color shift or luminance decrease when the organic EL element 1C is viewed from an oblique direction (wide angle) can be suppressed.

TABLE 10

|  | 0° | 45° | Color Difference Δu'v' |
|---|---|---|---|
| Ninth Embodiment | (0.33, 0.33) | (0.348, 0.344) | 0.012 |
| Example of Related Art | (0.33, 0.33) | (0.38, 0.36) | 0.032 |

Table 10 shows the results when the organic EL element 1C of this embodiment is compared with an organic EL element of related art for the color coordinate (x, y) and color difference (Δu'v') in a case in which the white light when the unit pixel group Px is caused to totally emit light is observed from the front face or from an oblique direction.

As shown in Table 10, the color coordinate (x, y) of the white light in an example of related art became (0.33, 0.33) in a case (0°) in which the light is observed from the front face, and the color coordinate became (0.38, 0.36) in a case (45°) in which the light is observed from an oblique direction. As a result, the color difference became 0.032. In such an example of related art, when being observed from an oblique direction, any color shift of green light may be caused, or the luminance of blue light may decrease, which result in yellow-based white light that is reddish as a whole.

In contrast, the color coordinate (x, y) of the green light in this embodiment became (0.33, 0.33) in a case (0°) in which the light is observed from the front face, and the color coordinate became (0.348, 0.344) in a case (45°) in which the light is observed from an oblique direction. As a result, the color difference became 0.012. In such an embodiment, it was confirmed that discoloration of the white light is hardly caused even when being observed from the front face or from an oblique direction.

As can be clear from Table 10, as compared with the example of related art which does not have a convexo-concave reflective layer 24, the color shift when being observed from a wide angle can be greatly reduced in this embodiment.

Tenth Embodiment of Organic EL Element

Next, a tenth embodiment of the organic EL element which constitutes the organic EL panel 1 will be described.

Figure 7:
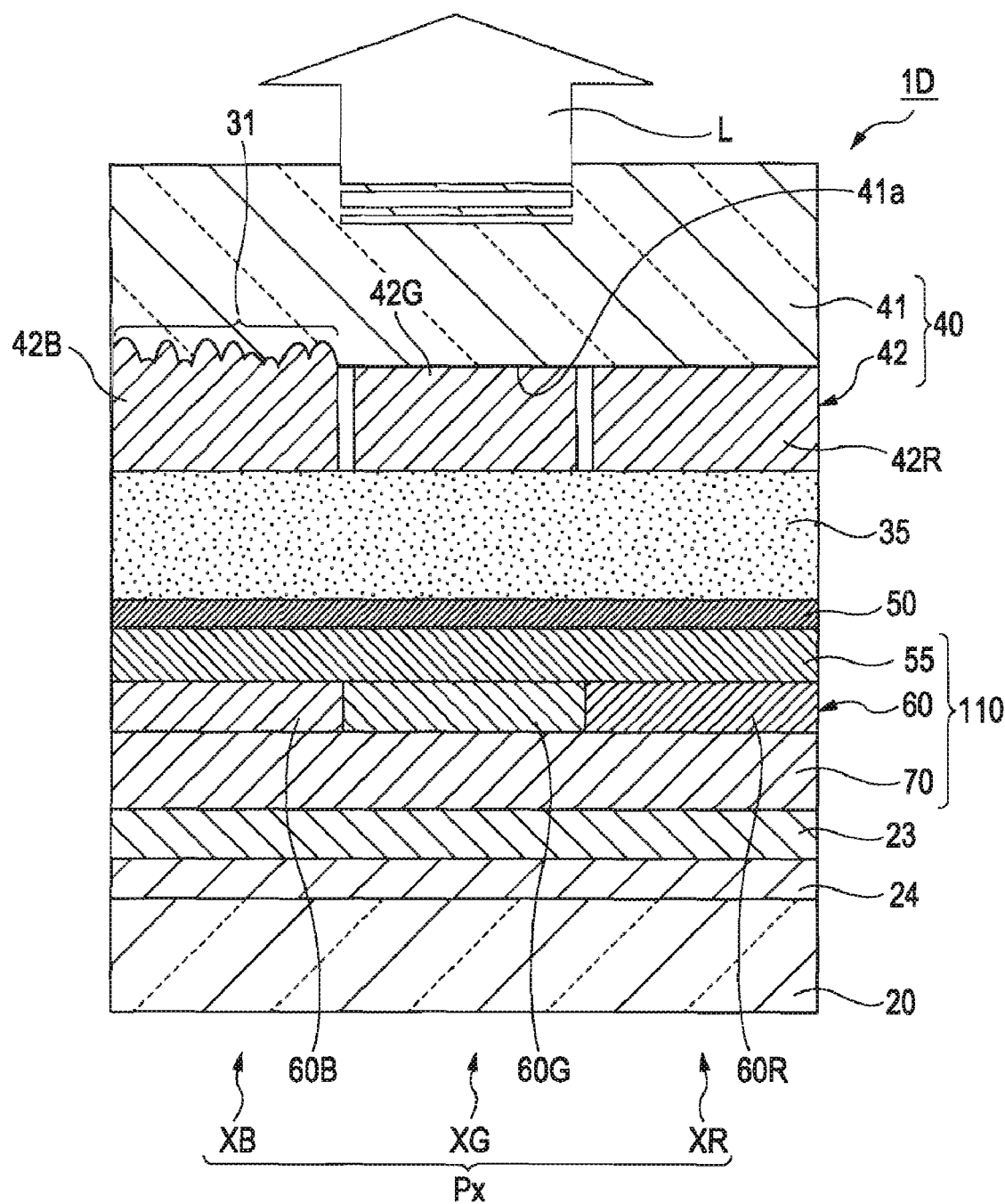
FIG. 7 is a sectional view schematically showing the configuration of an organic EL element related to a tenth embodiment of the invention.

FIG. 7 is a sectional view schematically showing a unit pixel group of an organic EL element 1D of this embodiment.

This embodiment is different from the previous embodiment in that it has a top emission structure including a color filter substrate. In the following description, the same components as those of the previous embodiment are denoted by the same reference numerals, and the description thereof is omitted.

The organic EL element (organic EL device) 1D of this embodiment includes a color filter substrate 40 arranged to face the substrate 20, and the bonding layer 35 which bonds the substrate 20 and the color filter substrate 40 together. Also, the luminescent functional layer 110 sandwiched by the above-mentioned pixel electrode 23 and negative electrode 50 is formed between the substrate 20 and the color filter substrate 40.

Here, the color filter substrate 40 includes a substrate body 41 and a colored layer 42 (42B, 42G, 42R).

Since the substrate body 41 is a substrate which constitutes a top emission type organic EL panel, transparent substrates, such as a glass substrate, are adopted. In this embodiment, a glass substrate which has the same refractive index (a refractive index of 1.54 to the light with a wavelength of 550 nm) as the substrate 20 is adopted as the substrate body 41.

The colored layer 42 is located between the substrate body 41 and the bonding layer 35, and the colored layers 42B, 42G, and 42R are provided corresponding to a plurality of pixels XB, XG, and XR, respectively, of the unit pixel group Px. That is, the colored layer 42B corresponds to the organic EL layer 60B of emitting blue light, the colored layer 42G corresponds to the organic EL layer 60G of emitting green light, and the colored layer 42R corresponds to the organic EL layer 60R of emitting red light.

Since this causes the luminescent light of each color of the organic EL layers 60B, 60G, and 60R to pass through a colored layer of the same color, the colored light emitted from each of the pixels XB, XG, and XR will have a color with high color density. Further, since such a colored layer 42 is included, it is possible to perform color correction of emitting light of the organic EL layers 60B, 60G, and 60R.

In addition, instead of the organic EL layers 60B, 60G, and 60R, each of the pixels XB, XG, and XR may be provided with an organic EL layer which can emit which white light. In this case, blue light can be obtained from the pixel XB when white light is transmitted through the colored layer 42B, green light can be obtained from the pixel XG when white light is transmitted through the colored layer 42G, and red light can be obtained from the pixel XR when white light is transmitted through the colored layer 42R.

Further, a concave and convex portion (scattering portion) 31 is provided in a position corresponding to the blue pixel XB on a surface 41a of the substrate body 41 between the substrate body 41 and the luminescent functional layer 42 (42B, 42G, 42R). That is, the concave and convex portion 31 is provided in the blue pixel XB selected from the unit pixel group Px. Here, "the position corresponding to the blue pixel XB" means a position where the blue pixel XB and the concave and convex portion 31 overlap each other, when being viewed from a direction vertical to the actual display region 4 of the organic EL element 1D. Further, in other words, such a concave and convex portion 31 is a portion formed on the surface 41a of the substrate body 41 between the substrate body 41 and the colored layer 42 (which will be described below).

Further, a method of forming such a concave and convex portion 31 is the same as the method of forming the above-mentioned concave and convex portion 21. According to this method, a number of random concave and convex portions 31 with a height of 0.01 to 0.5 μm can be formed by performing hydrofluoric acid treatment to the surface 41a of the substrate body 40.

Further, in the organic EL element 1D of this embodiment, the reflective film 24 is formed on the substrate 20, and the pixel electrode 23 is formed on the reflective film 24. Here, the pixel electrode 23 is not necessarily formed of a transparent conductive film, and may be a metallic reflective film.

This allows the reflective film 24 to become unnecessary and the number of manufacturing processes to be reduced Further, in the organic EL element 1D, the pixel electrode 23 may be formed with a different film thickness for each of the pixels XB, XG, and XR to adjust the optical length of an optical resonator (refer to FIGS. 5 and 6).

In this embodiment, if the organic EL layer 60 (60B, 60G, 60R) emits light, the luminescent light L is emitted directly through the negative electrode 50 and the color filter substrate 40, or is reflected by the reflective layer 24 and then emitted through the negative electrode 50 and the color filter substrate 40. At this time, in the blue pixel XB where the concave and convex portion 31 is formed, the interference light which has various kinds of optical path length is scattered by the concave and convex portion 31 when it enters the substrate body 41.

In contrast, in the related art in which the concave and convex portion 31 is not formed, if optical path length becomes long, light may deviate from the transparency range of the colored layer 42, and luminance may become dark. Further, although there is an absorption spectrum in the colored layer 42 and color shift is relieved, if a peak wavelength shifts to long wavelength side, this will cause color shift that may be recognized visually.

In contrast, according to this embodiment, in the blue pixel XB where the concave and convex portion 31 is formed; the interference light which has various kinds of optical path length is scattered by the concave and convex portion 31 when it enters the substrate body 41. Accordingly, since interference light beams which have various kinds of optical path length, i.e., interference light beams of various colors, coexist, and are randomly radiated, any color shift or luminance decrease when the organic EL element 1D is viewed from an oblique direction (wide angle) can be suppressed.

TABLE 11

|  | 0° | 45° |
| --- | --- | --- |
| Tenth Embodiment | 100% | 66.14% |
| Example of Related Art | 100% | 25.68% |

Table 11 shows the results when the organic EL element 1D of this embodiment is compared with an organic EL element of related art for the relative luminance in a case in which the luminescent light of the blue pixel XB is observed from the front face or from an oblique direction.

The results of Table 11 are measurement results when only the blue pixel XB is caused to emit light, and other pixels are caused not to emit light.

As can be clear from Table 11, the relative luminance is 25.68% in the example of related art which does not have such a concave and convex portion 31, whereas the relative luminance is 66.14% in this embodiment. Accordingly, it was confirmed that a decrease in the luminance of the blue pixel XB is suppressed in this embodiment. Further, it was confirmed that any color shift is suppressed by suppressing a luminance decrease.

Eleventh Embodiment of Organic EL Element

Next, an eleventh embodiment of the organic EL element will be described.

This embodiment is different from the tenth embodiment in that a concave and convex portion 31 is provided in a position corresponding to the green pixel XG. Further, since other components are the same as those of the tenth embodiment, they are denoted by the same reference numerals, and the description thereof is omitted.

In this embodiment, the concave and convex portion 31 is provided in the position corresponding to the green pixel XG on the surface 41a of the substrate body 41. That is, the concave and convex portion 31 is provided in the green pixel XG selected from the unit pixel group Px. A method of forming such a concave and convex portion 31 is the same as the method of forming the above-mentioned concave and convex portion 21. According to this method, a number of random concave and convex portions 31 with a height of 0.01 to 0.5 μm can be formed by performing hydrofluoric acid treatment to the surface 30a of the counter substrate 30.

In this embodiment, if the organic EL layer 60 (60B, 60G, 60R) emits light, the luminescent light L is emitted directly through the negative electrode 50 and the color filter substrate 40, or is reflected by the reflective layer 24 and then emitted through the negative electrode 50 and the color filter substrate 40. At this time, in the green pixel XG where the concave and convex portion 31 is formed, the interference light which has various kinds of optical path length is scattered by the concave and convex portion 31 when it enters the substrate body 41.

Accordingly, since interference light beams which have various kinds of optical path length, i.e., interference light beams of various colors, coexists, and are randomly radiated to an air interface as described above, any color shift or luminance decrease when the organic EL element 1C is viewed from an oblique direction (wide angle) can be suppressed.

Further, according to this embodiment, since it is possible to increase a viewing angle for green when low-molecular-weight material with less green light quantity than high-molecular-weight material is used, it becomes easy to acquire a high luminance of wide viewing angle.

Further, although the organic EL layer 60G is made of high-molecular-weight materials, the light of around 550 nm can be extracted when being observed from an oblique direction.

TABLE 12

|  | 0° | 45° |
| --- | --- | --- |
| Eleventh Embodiment | 100% | 50.28% |
| Example of Related Art | 100% | 44.61% |

Table 12 shows the results when the organic EL element 1D of this embodiment is compared with an organic EL element of related art for the relative luminance in a case in which the luminescent light of the green pixel XG is observed from the front face or from an oblique direction.

The results of Table 12 are measurement results when only the green pixel XG is caused to emit light, and other pixels are caused not to emit light.

As can be clear from Table 12, the relative luminance is 44.61% in the example of related art which does not have such a concave and convex portion 31, whereas the relative luminance is 50.28% in this embodiment. Accordingly, it was confirmed that a decrease in the luminance of the green pixel XG is suppressed in this embodiment. Further, it was confirmed that any color shift is suppressed by suppressing a luminance decrease.

Twelfth Embodiment of Organic EL Element

Next, a twelfth embodiment of the organic EL element will be described.

This embodiment is different from the tenth embodiment in that concave and convex portions 31 are provided in positions corresponding to the green pixel XG and the blue pixel XB. Further, since other components are the same as those of the tenth embodiment, they are denoted by the same reference numerals, and the description thereof is omitted.

In this embodiment, the concave and convex portions 31 are provided in the positions corresponding to the green pixel XG and the blue pixel XB on the surface 41a of the substrate body 41. That is, the concave and convex portions 31 are provided in the green pixel XG and the blue pixel XB selected from the unit pixel group Px. A method of forming such a concave and convex portion 31 is the same as the method of forming the above-mentioned concave and convex portion 21. According to this method, a number of random concave and convex portions 31 with a height of 0.01 to 0.5 km can be formed by performing hydrofluoric acid treatment to the surface 30a of the counter substrate 30.

In this embodiment, if the organic EL layer 60 (60B, 60G, 60R) emits light, the luminescent light L is emitted directly through the negative electrode 50 and the color filter substrate 40, or is reflected by the reflective layer 24 and then emitted through the negative electrode 50 and the color filter substrate 40. At this time, in the green pixel XG and the blue pixel XB where the concave and convex portions 31 are formed, the interference light which has various kinds of optical path length is scattered by the concave and convex portions 31 when it enters the substrate body 41.

Accordingly, since interference light beams which have various kinds of optical path length, i.e., interference light beams of various colors, coexist, and are randomly radiated to an air interface as described above, any color shift or luminance decrease when the organic EL element 1D is viewed from an oblique direction (wide angle) can be suppressed.

TABLE 13

|  | 0° | 45° | Color Difference Δu'v' |
|---|---|---|---|
| Twelfth Embodiment | (0.33, 0.33) | (0.344, 0.344) | 0.010 |
| Example of Related Art | (0.33, 0.33) | (0.38, 0.36) | 0.032 |

Table 13 shows the results when the organic EL element 1D of this embodiment is compared with an organic EL element of related art for the color coordinate (x, y) and color difference (Δu'v') in a case in which the white light when the unit pixel group Px Ls caused to totally emit light is observed from the front face or from an oblique direction.

As shown in Table 13, the color coordinate (x, y) of the white light in an example of related art became (0.33, 0.33) in a case (0°) in which the light is observed from the front face, and the color coordinate became (0.38, 0.36) in a case (45°) in which the light is observed from an oblique direction. As a result, the color difference became 0.032. In such an example of related art, when being observed from an oblique direction, any color shift of green light may be caused, or the luminance of blue light may decrease, which result in yellow-based white light that is reddish as a whole.

In contrast, the color coordinate (x, y) of the green light in this embodiment became (0.33, 0.33) in a case (0°) in which the light is observed from the front face, and the color coordinate became (0.344, 0.344) in a case (45°) in which the light is observed from an oblique direction. As a result, the color difference became 0.010. In such an embodiment, it was confirmed that discoloration of the white light is hardly caused even when being observed from the front face or from an oblique direction.

As can be clear from Table 13, as compared with the example of related art which does not have a concave and convex portion 31, the color shift when being observed from a wide angle, is greatly reduced in this embodiment.

Thirteenth Embodiment of Organic EL Element

Next, a thirteenth embodiment of the organic EL element which constitutes the organic EL panel 1 will be described.

FIG. 8A is a sectional view schematically showing a unit pixel group of an organic EL element 1E of this embodiment.

This embodiment is different from the previous embodiment that an overcoat layer is formed on a color filter substrate in a top emission structure. In the following description, the same components as those of the previous embodiment are denoted by the same reference numerals, and the description thereof is omitted.

The organic EL element (organic EL device) 1E of this embodiment includes the color filter substrate 40 arranged to face the substrate 20 and the bonding layer 35 which bonds the substrate 20 and the color filter substrate 40. Also, the luminescent functional layer 110 sandwiched by the above-mentioned pixel electrode 23 and negative electrode 50 is formed between the substrate 20 and the color filter substrate 40.

Here, the color filter substrate 40 includes the colored layer 42 (42B, 42G, 42R) and an overcoat layer 43 from the substrate body 41 toward the luminescent functional layer 110.

Further, in the organic EL device 1E, the pixel electrode 23 may be formed with a different film thickness for each of the pixels XB, XC, and XR to adjust the optical length of an optical resonator (refer to FIGS. 5 and 6).

The overcoat layer 43 is a layer film formed of resin material having a refractive index which is different from that of the colored layer 42. Further, at the interface between the overcoat layer 43 and the colored layer 42, a concave and convex portion (scattering portion) 45 is formed on the surface of the colored layer 42B corresponding to the blue pixel XB. That is, the concave and convex portion 45 is provided in the blue pixel XB selected from the unit pixel group Px. Further, the green pixel XG and the red pixel XR are not formed with such a concave and convex portion 45, but are made a flat surface.

A method of forming such colored layer 42 and overcoat layer 43 will be described.

First, in the blue pixel XB, the colored layer 42B made of blue acrylic material is formed on the surface of the substrate body 41, and thereafter ozone plasma treatment for 10 seconds is performed on the colored layer 42B. Thereby, the surface of the colored layer 42B will have random irregularities with a depth of 0.01 to 0.5 μm, and consequently have the concave and convex portion 45 formed thereon. Thereafter, the colored layer 42G is formed in the green pixel XG, and the colored layer 42R is formed in the red pixel XR. Thereafter, the overcoat layer 43 is formed by, for example, a spin coat method. Through the above steps, the colored layer 42 and the overcoat layer 43 are formed on the substrate body 41.

Further, after the overcoat layer 43 is formed, the organic EL element 1E is formed by bonding the color filter substrate 40 and the substrate 20 together with the bonding layer 35 therebetween.

In this embodiment, if the organic EL layer 60 (60B, 60G, 60R) emits light, the luminescent light L is emitted directly through the negative electrode 50 and the color filter substrate 40, or is reflected by the reflective layer 24 and then emitted through the negative electrode 50 and the color filter substrate 40. At this time, in the blue pixel XB where the concave and convex portion 45 is formed, the interference light which has various kinds of optical path length is scattered by the concave and convex portion 45 when it enters the interface between the overcoat layer 43 and the colored layer 42B. Accordingly, since the direction of interference light beams which have various kinds of optical path length changes, any color shift or luminance decrease when the organic EL element 1E is viewed from an oblique direction (wide angle) can be suppressed.

Modification of Thirteenth Embodiment of Organic EL Element

Next, a modification of the thirteenth embodiment of the organic EL element will be described.

FIG. 8B is a sectional view schematically showing a unit pixel group of the organic EL element 1F of this modification. This modification is different from the previous thirteenth embodiment in that the concave and convex portion 45 is formed in the overcoat layer 43. In the following description, the same components as those of the previous embodiment are denoted by the same reference numerals, and the description thereof is omitted.

In the organic EL element (organic EL device) 1F of this modification, the overcoat layer 43 is a layer film formed of resin material with a refractive index which is different from that of the colored layer 42. Further, at the interface between the overcoat layer 43 and the bonding layer 35, a concave and convex portion (scattering portion) 45 is formed on the surface of the overcoat layer 43 corresponding to the blue pixel XB. Further, the green pixel XG and the red pixel XR are not formed with such a concave and convex portion 45, but are made a flat surface.

A method of forming such an overcoat layer 43 will be described.

First, the colored layer 42B is formed in the blue pixel XB, the colored layer 42G is formed in the green pixel XG, and the colored layer 42R is formed in the red pixel XR. Thereafter, the overcoat layer 43 is formed on the surface of the colored layers 42B, 42G, and 42R by a spin coat method. Thereafter, ozone plasma treatment for 10 seconds is performed only on the overcoat layer 43 corresponding to the blue pixel XE. Thereby, the surface of the overcoat layer 43 in the blue pixel XB will have random regularities with a depth of 0.01 to 0.5 μm, and consequently have the concave and convex portion 45 formed thereon. Through the above steps, the colored layer 42 and the overcoat layer 43 are formed on the substrate body 41.

Further, after the overcoat layer 43 is formed, the organic EL element 1E is formed by bonding the color filter substrate 40 and the substrate 20 together with the bonding layer 35 therebetween.

In this embodiment, if the organic EL layer 60 (60B, 60G, 60R) emits light, the luminescent light L is emitted directly through the negative electrode 50 and the color filter substrate 40, or is reflected by the reflective layer 24 and then emitted through the negative electrode 50 and the color filter substrate 40. At this time, in the blue pixel XE where the concave and convex portion 45 is formed, the interference light which has various kinds of optical path length is scattered by the concave and convex portion 45 when it enters the interface between the bonding layer 35 and the overcoat layer 43. Accordingly, since the direction of interference light beams which have various kinds of optical path length changes, any color shift or luminance decrease when being viewed from an oblique direction (wide angle) can be suppressed.

TABLE 14

|  | 0° | 45° |
|---|---|---|
| Thirteenth Embodiment | 100% | 60.02% |
| Example of Related Art | 100% | 22.23% |

Table 14 shows the results when the organic EL element 1A of this embodiment is compared with an organic EL element of related art for the relative luminance in a case in which the luminescent light of the blue pixel XB in the thirteenth embodiment is observed from the front face or from an oblique direction.

The results of Table 14 are measurement results when only the blue pixel XB is caused to emit light, and other pixels are caused not to emit light.

As can be clear from Table 14, the relative luminance is 22.23% in the example of related art which does not have such a concave and convex portion 45, whereas the relative luminance is 60.02% in this embodiment. Accordingly, it was confirmed that a decrease in the luminance of the blue pixel XB is suppressed in this embodiment. Further, it was confirmed that any color shift is suppressed by suppressing a luminance decrease.

Further, the same results were also obtained in the modification of the above thirteenth embodiment.

TABLE 15

| | $\Delta n$ | | | | | | | | |
|---|---|---|---|---|---|---|---|---|---|
| | 0 | ±0.01 | ±0.03 | ±0.05 | ±0.07 | ±0.08 | ±0.09 | ±0.1 | ±0.3 | ±0.5 |
| Relative luminance | 22.23% | 23.15% | 24.11% | 24.18% | 24.88% | 57.23% | 59.05% | 59.55% | 60.02% | 61.23% |

Table 15 shows the relative luminance when the emitting light of the blue pixel XB is observed from an oblique direction (45°) about the case in which the refractive index difference between the colored layer 42 and the overcoat layer 43 and the refractive index difference between the overcoat layer 43 and the bonding layer 35 in the thirteenth embodiment and its modification is changed.

Further, in Table 15, "Δn" means the refractive index difference between the colored layer 42 and the overcoat layer 43, or the refractive index difference between the overcoat layer 43 and the bonding layer 35. Further, in Table 15, that Δn is "0" means a case in which the concave and convex portion 45 is not formed.

As can be clear from Table 15, it can be understood that the relative luminance observed from a 45° viewing angle becomes about 57% or more when the above-mentioned refractive index difference is 0.08, and the relative luminance becomes still greater when the refractive index difference is greater than 0.08. It was confirmed that a decrease in the luminance of the blue pixel XB is suppressed by forming the concave and convex portion 45 and setting the refractive index difference between the colored layer 42 and the overcoat layer 43 and the refractive index difference between the overcoat layer 43 and the bonding layer 35 to 0.08 or more in this way. Further, it was confirmed that any color shift is suppressed by suppressing a luminance decrease. Further, it was confirmed that the same effects can be obtained even if Δn is a positive value or a negative value.

Fourteenth Embodiment of Organic EL Element

Next, a fourteenth embodiment of the organic EL element will be described.

This embodiment is different from the thirteenth embodiment in that a concave and convex portion 45 is provided in a position corresponding to the green pixel XG. Further, since other components are the same as those of the thirteenth embodiments they are denoted by the same reference numerals, and the description thereof is omitted.

In this embodiment, the concave and convex portion 45 is provided in the colored layer 42G of the green pixel XG. That is, the concave and convex portion 45 is provided in the green pixel XG selected from the unit pixel group Px. The method of forming such a concave and convex portion 45 is the same as that of the thirteenth embodiment, and the concave and convex portion 45 which has a number of random irregularities with a height of 0.01 to 0.5 μm is formed only on the portion of the colored layer 42G corresponding to the green pixel XG.

In this embodiment, if the organic EL layer 60 (60B, 60G, 60R) emits light, the luminescent light L is emitted directly through the negative electrode 50 and the color filter substrate 40, or is reflected by the reflective layer 24 and then emitted through the negative electrode 50 and the color filter substrate 40. At this time, in the green pixel XG where the concave and convex portion 45 is formed, the interference light which has various kinds of optical path length is scattered by the concave and convex portion 45 when it enters the interface between the overcoat layer 43 and the colored layer 42B. Accordingly, since the direction of interference light beams which have various kinds of optical path length changes, any color shift or luminance decrease when the organic EL element 1E is viewed from an oblique direction (wide angle) can be suppressed.

TABLE 16

| | 0° | 45° |
|---|---|---|
| Fourteenth Embodiment | 100% | 48.66% |
| Example of Related Art | 100% | 40.22% |

Table 16 shows the results when the organic EL element 1E of this embodiment is compared with an organic EL element of related art for the relative luminance in a case in which the luminescent light of the green pixel XG is observed from the front face or from an oblique direction.

The results of Table 16 are measurement results when only the green pixel XG is caused to emit light, and other pixels are caused not to emit light.

As can be clear from Table 16, the relative luminance is 40.22% in the example of related art which does not have such a concave and convex portion 45, whereas the relative luminance is 48.66% in this embodiment. Accordingly, it was confirmed that a decrease in the luminance of the green pixel XG is suppressed in this embodiment. Further, it was confirmed that any color shift is suppressed by suppressing a luminance decrease.

Fifteenth Embodiment of Organic EL Element

Next, a fifteenth embodiment of the organic EL element will be described.

This embodiment is different from the thirteenth embodiment in that concave and convex portions 45 are provided in positions corresponding to the green pixel XG and the blue pixel XB. Further, since other components are the same as those of the thirteenth embodiment, they are denoted by the same reference numerals, and the description thereof is omitted.

In this embodiment, the concave and convex portions 45 are provided in the colored layer 42B of the blue pixel XB and the colored layer 42G of the green pixel XG, respectively. That is, the concave and convex portions 45 are provided in the blue pixel XB and the green pixel XG selected from the unit pixel group Px. The method of forming such a concave and convex portion 45 is the same as that of the thirteenth embodiment, and the concave and convex portions 45 which have a number of random irregularities with a height of 0.01 to 0.5 μm are formed on the colored layers 42G and 42G.

In this embodiment, if the organic EL layer 60 (60B, 60G, 60R) emits light, the luminescent light L is emitted directly through the negative electrode 50 and the color filter substrate 4Q, or is reflected by the reflective layer 24 and then emitted through the negative electrode 50 and the color filter substrate 40. At this time, in the blue pixel XB and the green pixel XG where the concave and convex portion 45 is formed, the interference light which has various kinds of optical path length is scattered by the concave and convex portion 45 when it enters the interface between the overcoat layer 43 and the colored layer 42B, 42G. Accordingly, since the direction of interference light beams which have various kinds of optical path length changes, any color shift or luminance decrease when the organic EL element 1E is viewed from an oblique direction (wide angle) can be suppressed.

TABLE 17

| | 0° | 45° | Color Difference Δu'v' |
|---|---|---|---|
| Fifteenth Embodiment | (0.33, 0.33) | (0.332, 0.341) | 0.007 |
| Example of Related Art | (0.33, 0.33) | (0.371, 0.362) | 0.027 |

Table 17 shows the results when the organic EL element 1E of this embodiment is compared with an organic EL element of related art for the color coordinate (x, y) and color difference (Δu'v') in a case in which the white light when the unit pixel group Px is caused to totally emit light is observed from the front face or from an oblique direction.

As shown in Table 17, the color coordinate (x, y) of the white light in an example of related art became (0.33, 0.33) in a case (0°) in which the light is observed from the front face, and the color coordinate became (0.371, 0.362) in a case (45°) in which the light is observed from an oblique direction. As a result, the color difference became 0.027. In such an example of related art, when being observed from an oblique direction, any color shift of green light may be caused, or the luminance of blue light may decrease, which result in yellow-based white light that is reddish as a whole.

In contrast, the color coordinate (x, y) of the green light in this embodiment became (0.33, 0.33) in a case (0°) in which the light is observed from the front face, and the color coordinate became (0.332, 0.341) in a case (45°) in which the light is observed from an oblique direction. As a result, the color difference became 0.007. In such an embodiment, it was confirmed that discoloration of the white light is hardly caused even when being observed from the front face or from an oblique direction.

As can be clear from Table 17, as compared with the example of related art which does not have a concave and convex portion 45, the color shift when being observed from a wide angle is greatly reduced in this embodiment.

Sixteenth Embodiment

Next, a sixteenth embodiment of the organic EL element which constitutes the organic EL panel I will be described.

FIG. 9 is a sectional view schematically showing a unit pixel group of an organic EL element 1G of this embodiment This embodiment is different from the previous embodiment in which resin particles (particles) is contained in the bonding layer 35. In the following description, the same components as those of the previous embodiment are denoted by the same reference numerals, and the description thereof is omitted.

The organic EL element (organic EL device) 1G of this embodiment includes a color filter substrate 40 arranged to face a substrate 20, and a bonding layer 35 which bonds the substrate 20 and the color filter substrate 40 together.

The bonding layer 35 is composed of resin filler 35a, such as, for example, acrylics and epoxy, as a chief material, and a plurality of resin particles (scattering portion) 36 contained in the position corresponding to the blue pixel XG. That is, the resin particles 36 are provided in the blue pixel XB selected from the unit pixel group Px. Here, "the position corresponding to the blue pixel XB" means a position where the blue pixel XB and the plurality of resin particles 36 overlap each other, when being viewed from a direction vertical to the actual display region 4 of the organic EL element 1G.

Here, the refractive index of the resin filler 35a and the refractive index of the resin particles 36 are different from each other. Further, the resin particles 36 will do so long as they are particulate, and microscopically may be resin spherical bodies or resin pieces. Further, the resin particles are not limited to the resin material but may be organic material or inorganic material whose refractive index is different from that of the resin filler 35a.

Further, in the organic EL device 1G, the pixel electrode 23 may be formed with a different film thickness for each of the pixels XB, XG, and XR to adjust the optical length of an optical resonator (refer to FIGS. 5 and 6).

Further, as a step of causing the resin particles 36 to be contained in the resin filler 35a, a method of causing the resin particles 36 to be dispersed only on the portion corresponding to the blue pixel XB after the resin filler 35a is coated on the color filter substrate 40 or the substrate 20 is exemplified. Otherwise, a method of discharging a coating material which is the resin particles 36 are dispersed the resin filler 35a only onto the portion corresponding to the blue pixel XB by a dispenser etc., and discharging only the resin filler 35a onto the green pixel XG or the red pixel XR is exemplified.

Further, after the bonding layer 35 including the resin particles 36 and the resin filler 35a is coated on the color filter substrate 40 or the substrate 20, the organic EL element 1G is formed by bonding the substrates 20 and 40 together In this embodiment, if the organic EL layer 60 (60B, 60G, 60R) emits light, the luminescent light L is emitted directly through the negative electrode 50 and the color filter substrate 40, or is reflected by the reflective layer 24 and then emitted through the negative electrode 50 and the color filter substrate 40. In this case, in the blue pixel XB in which a plurality of resin particles 36 are dispersed, when the interference light which has various kinds of optical path length is transmitted through the bonding layer 35, the light is scattered according to a refractive index difference between the resin filler 35a and the resin particles 36. Accordingly, since the traveling direction of interference light beams which have various kinds of optical path length changes according to the refractive index difference, any color shift or luminance decrease when the organic EL element 1G is viewed from an oblique direction (wide angle) can be suppressed.

TABLE 18

|  | 0° | 45° |
| --- | --- | --- |
| Sixteenth Embodiment | 100% | 65.66% |
| Example of Related Art | 100% | 23.15% |

Table 18 shows the results when the organic EL element 1C of this embodiment is compared with an organic EL element of related art For the relative luminance In a case in which the luminescent light of the blue pixel XB is observed from the front face or from an oblique direction.

The results of Table 18 are measurement results when only the blue pixel XB is caused to emit light, and other pixels are caused not to emit light.

As can be clear from Table 18, the relative luminance is 23.15% in the example of related art which does not have such resin particles 36, whereas the relative luminance is 65.66% in this embodiment. Accordingly, it was confirmed that a decrease in the luminance of the blue pixel XB is suppressed in this embodiment. Further, it was confirmed that any color shift is suppressed by suppressing a luminance decrease.

TABLE 19

| | | | | | Δn | | | | | |
|---|---|---|---|---|---|---|---|---|---|---|
| | 0 | ±0.01 | ±0.03 | ±0.05 | ±0.07 | ±0.08 | ±0.09 | ±0.1 | ±0.3 | ±0.5 |
| Relative luminance | 23.15% | 23.42% | 23.80% | 24.99% | 25.23% | 60.28% | 61.87% | 62.59% | 65.66% | 65.82% |

Table 19 shows the relative luminance when the emitting light of the blue pixel XB is observed from an oblique direction (45°) about the case in which the refractive index difference between the resin filler 35a and the resin particles 36 in the organic EL element 1G of the sixteenth embodiment is changed.

Further, in Table 19, "Δn" means the refractive index difference between the resin filler 35a and the resin particles 36. Further, in Table 19, that Δn is "0" means a case in which the resin particles 36 are not contained in the bonding layer 35.

As can be clear from Table 19, it can be understood that the relative luminance observed from a 45° viewing angle becomes about 60% or more when the above-mentioned refractive index difference is 0.08, and the relative luminance becomes still greater when the refractive index difference is greater than 0.08. It was confirmed that a decrease in the luminance of the blue pixel XB is suppressed by causing the resin particles 36 to be contained in the bonding layer 35 and setting the refractive index difference between the resin filler 35a and the resin particles 36 to 0.08 or more in this way. Further, it was confirmed that any color shift is suppressed by suppressing a luminance decrease. Further, it was confirmed that the same effects can be obtained even if Δn is a positive value or a negative value.

Seventeenth Embodiment of Organic EL Element

Next, a seventeenth embodiment of the organic EL element will be described.

This embodiment is different from the sixteenth embodiment in that a plurality of resin particles 36 is provided in the position corresponding to the green pixel XG. Further, since other components are the same as those of the sixteenth embodiment, they are denoted by the same reference numerals, and the description thereof is omitted.

In this embodiment, the resin particles 36 are contained in the bonding layer 35 so as to correspond to the green pixel XG. That is, the resin particles 36 are provided in the green pixel XG selected from the unit pixel group Px. As such, the method of causing the resin particles 36 to be dispersed in the bonding layer 35 is the same as that of the sixteenth embodiment In this embodiment, if the organic EL layer 60 (60B, 60G, 60R) emits light, the luminescent light L is emitted directly through the negative electrode 50 and the color filter substrate 40, or is reflected by the reflective layer 24 and then emitted through the negative electrode 50 and the color filter substrate 40. In this case, in the green pixel XG in which a plurality of resin particles 36 are dispersed, when the interference light which has various kinds of optical path length is transmitted through the bonding layer 35, the light is scattered according to a refractive index difference between the resin filler 35a and the resin particles 36. Accordingly, since the traveling direction of interference light beams which have various kinds of optical path length changes according to the refractive index difference, any color shift or luminance decrease when the organic EL element 1G is viewed from an oblique direction (wide angle) can be suppressed.

Furthers according to this embodiment, since it is possible to increase a viewing angle for green when low-molecular-weight material with less green light quantity than high-molecular-weight material is used, it becomes easy to acquire a high luminance of wide viewing angle.

Further, although the organic EL layer 60G is made of high-molecular-weight materials, the light of around 550 nm can be extracted when being observed from an oblique direction.

TABLE 20

| | 0° | 45° |
|---|---|---|
| Seventeenth Embodiment | 100% | 49.65% |
| Example of Related Art | 100% | 40.28% |

Table 20 shows the results when the organic EL element 1G of this embodiment is compared with an organic EL element of related art for the relative luminance in a case in which the luminescent light of the green pixel XG is observed from the front face or from an oblique direction.

The results of Table 20 are measurement results when only the green pixel XG is caused to emit light, and other pixels are caused not to emit light.

As can be clear from Table 20, the relative luminance is 40.28% in the example of related art which does not have such resin particles 36, whereas the relative luminance is 49.65% in this embodiment. Accordingly, it was confirmed that a decrease in the luminance of the green pixel XG is suppressed in this embodiment. Further, it was confirmed that any color shift is suppressed by suppressing a luminance decrease.

Although the above effects are obtained in this embodiment by using the bonding layer 35 in which resin pieces or resin spherical bodies having a different refractive index are dispersed, other materials may be adopted as long as they are resin with a scattering function.

Eighteenth Embodiment of Organic EL Element

Next, an eighteenth embodiment of the organic EL element will be described.

This embodiment is different from the sixteenth embodiment in that a plurality of resin particles 36 are provided in the positions corresponding to the green pixel XG and the blue pixel XB. Further, since other components are the same as those of the sixteenth embodiment, they are denoted by the same reference numerals, and the description thereof is omitted.

In this embodiment, the resin particles 36 are contained in the bonding layer 35 so as to correspond to the green pixel XG and the blue pixel XE. That is, the resin particles 36 are provided in the green pixel XG and the blue pixel XB selected from the unit pixel group Px. As such, the method of causing the resin particles 36 to be dispersed in the bonding layer 35 is the same as that of the sixteenth embodiment.

In this embodiment, if the organic EL layer 60 (60B, 60G, 60R) emits light, the luminescent light L is emitted directly through the negative electrode 50 and the color filter substrate 40, or is reflected by the reflective layer 24 and then emitted through the negative electrode 50 and the color filter substrate 40. In this case, in the green pixel XG and the blue pixel XB in which a plurality of resin particles 36 are dispersed, when the interference light which has various kinds of optical path length is transmitted through the bonding layer 35, the light is scattered according to a refractive index difference between the resin filler 35a and the resin particles 36. Accordingly, since the traveling direction of interference light beams which have various kinds of optical path length changes according to the refractive index difference, any color shift or luminance decrease when the organic EL element 1G is viewed from an oblique direction (wide angle) can be suppressed.

TABLE 21

|  | 0° | 45° | Color Difference Δu'v' |
|---|---|---|---|
| Eighteenth Embodiment | (0.33, 0.33) | (0.348, 0.344) | 0.012 |
| Example of Related Art | (0.33, 0.33) | (0.38, 0.35) | 0.032 |

Table 21 shows the results when the organic EL element 1G of this embodiment is compared with an organic EL element of related art for the color coordinate (x, y) and color difference (Δu'v') in a case in which the white light when the unit pixel group Px is caused to totally emit light is observed from the front face or from an oblique direction.

As shown in Table 21, the color coordinate (x, y) of the white light in an example of related art became (0.33, 0.33) in a case (0°) in which the light is observed from the front face, and the color coordinate became (0.38, 0.35) in a case (45°) in which the light is observed from an oblique direction. As a result, the color difference became 0.032. In such an example of related art, when being observed from an oblique direction, any color shift of green light may be caused, or the luminance of blue light may decrease, which result in yellow-based white light that is reddish as a whole.

In contrast, the color coordinate (x, y) of the green light in this embodiment became (0.33, 0.33) in a case (0°) in which the light is observed from the front face, and the color coordinate became (0.348, 0.344) in a case (45°) in which the light is observed from an oblique direction. As a result, the color difference became 0.012. In such an embodiment, it was confirmed that discoloration of the white light is hardly caused even when being observed from the front face or from an oblique direction.

As can be clear from Table 21, as compared with the example of related art which does not have a concave and convex portion 31, the color shift when being observed from a wide angle is greatly reduced in this embodiment.

Electronic Apparatus

Next, the electronic apparatus of the invention will be described.

Examples of the electronic apparatus, having the above-mentioned organic EL panel 1 as a display, specifically include electronic apparatuses shown in FIG. 10.

Figure 10A:
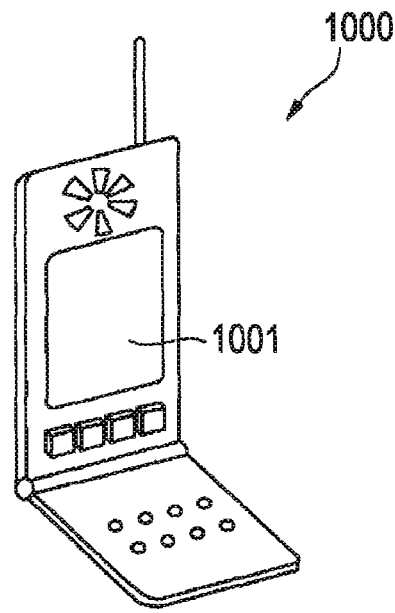
FIG. 10 is a view showing an electronic apparatus provided with the organic EL device of the invention.

FIG. 10A is a perspective view showing an example of a portable telephone. In FIG. 13A, the portable telephone 1000 includes a display 1001 using the above-mentioned organic EL panel 1.

Figure 10B:
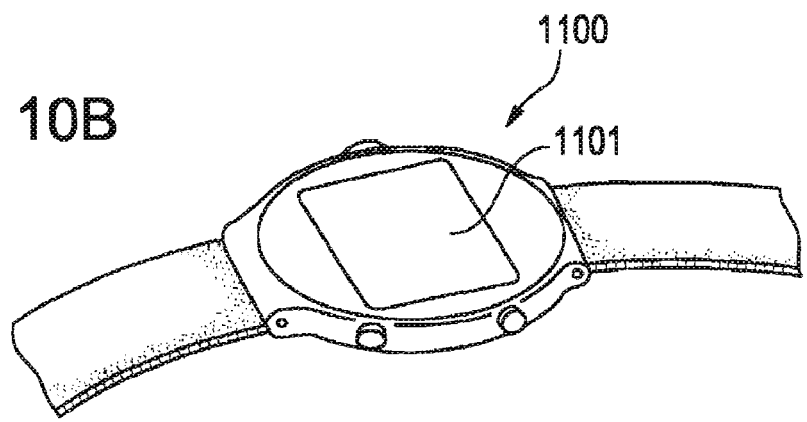

FIG. 10B is a perspective view showing an example of a wrist watch type electronic apparatus. In FIG. 10B, the watch 1100 includes a display 1101 using the above-mentioned organic EL panel 1.

Figure 10C:
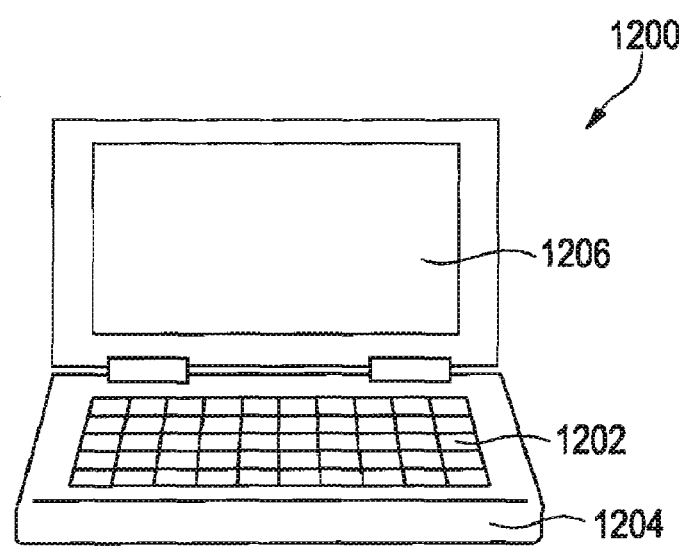

FIG. 10C is a perspective view showing an example of portable information processors, such as a word processor and a personal computer. In FIG. 10C, the information processor 1200 includes an input unit 1201, such as a keyboard, a display 1202 using the above-mentioned organic EL panel 1, and an information processor body (case) 1203.

Since each of the electronic apparatus shown in FIGS. 10A to 10C includes the display 1001, 1101, or 1202 having the above-mentioned organic EL panel (organic EL device), high luminance of the organic EL device which constitutes the display is realized, and any color shift is suppressed.

The entire disclosure of Japanese Patent application No. 2005-256080, field Sep. 5, 2005 is expressly incorporated by reference herein.

What is claimed is:

1. An organic electroluminescent device comprising:
   pixels, each of the pixels having an organic EL element that includes a first electrode, a second electrode, and a luminescent functional layer which is sandwiched by the first electrode and the second electrode, and
   a scattering portion which scatters luminescent light of the luminescent functional layer,
   the pixels including a red pixel emitting red light, a green pixel emitting green light and a blue pixel emitting blue light, and
   the scattering portion being located at position corresponding to one of a group consisting of only the green pixel, only the blue pixel, and only the green pixel and the blue pixel.

2. The organic electroluminescent device according to claim 1, further comprising a substrate,
   wherein the scattering portion is formed by having a concave and convex portion, which allows the surface of the substrate to scatter visible light, between the substrate and the luminescent functional layer.

3. The organic electroluminescent device according to claim 1, wherein a planarizing layer is formed in contact with the scattering portion.

4. The organic electroluminescent device according to claim 3, further comprising a substrate,
   wherein the refractive index of the planarizing layer is different from the refractive index of the substrate.

5. The organic electroluminescent device according to claim 1,
   wherein the scattering portion is a reflective layer formed in a concave and convex portion.

6. The organic electroluminescent device according to claim 1, further comprising a substrate, a counter substrate and a bonding layer, the counter substrate being arranged to face the substrate and the boning layer bonds the substrate and the counter substrate together,
   wherein the scattering portion is a concave and convex portion formed on the surface of the counter substrate between the counter substrate and the luminescent functional layer.

7. The organic electroluminescent device according to claim 6,
   wherein the refractive index of the bonding layer is different from the refractive index of the counter substrate.

8. The organic electroluminescent device according to claim 1, further comprising a substrate, a color filter substrate and a bonding layer, the color filter substrate being arranged to face the substrate and the bonding layer bonds the substrate and the color filter substrate together, wherein the color filter substrate has a substrate body and a colored layer of plural colors corresponding to the plurality of pixels, respectively, of a unit pixel group toward the luminescent functional layer from the color filter substrate, and wherein the scattering portion is a concave and convex portion formed on the surface of the substrate body between the substrate body and the colored layer.

9. The organic electroluminescent device according to claim 1, further comprising a substrate, a color filter substrate and a bonding layer, the color filter substrate being arranged to face the substrate and the bonding layer bonds the substrate and the color filter substrate together, wherein the color filter substrate has a substrate body, a colored layer of plural colors corresponding to the plurality of pixels, respectively, of a unit pixel group toward the luminescent functional layer from the color filter substrate, and an overcoat layer, and wherein the scattering portion is a concave and convex portion formed on the surface of the overcoat layer, or the surface of the colored layer.

10. The organic electroluminescent device according to claim 1 further comprising a substrate, a counter substrate and a bonding layer, the counter substrate being arranged to face the substrate and the bonding layer bonds the substrate and the counter substrate together, wherein the bonding layer has resin filler and particles, serving as the scattering portion, and the refractive index of the particles is different from the refractive index of the resin filler.

11. The electronic apparatus comprising the organic electroluminescent device according to claim 1.

12. A method of manufacturing an organic electroluminescent device comprising, pixels, each of the pixels having an organic EL element that includes a first electrode, a second electrode, and a luminescent functional layer which is sandwiched by the first electrode and the second electrode, the pixels including a red pixel emitting red light, a green pixel emitting green light and a blue pixel emitting blue light, the method comprising forming a scattering portion, which scatters luminescent light of the luminescent functional layer, and the scattering portion being located at position corresponding to one of a group consisting of only the green pixel, only the blue pixel, and only the green pixel and the blue pixel.

13. The method of manufacturing an organic electroluminescent device according to claim 12, wherein the organic electroluminescent device further comprises a substrate, and wherein the step of forming a scattering portion includes performing hydrofluoric acid treatment on the substrate or patterning any one of silicon oxide, silicon nitride and a resin layer on the substrate, thereby forming a concave and convex portion in the substrate.

14. The method of manufacturing an organic electroluminescent device according to claim 12, wherein the step of forming a scattering portion includes forming a resin layer and thereafter performing ozone plasma treatment on the resin layer, thereby forming a concave and convex portion in the resin layer.

* * * * *